US012588301B2

(12) United States Patent
Ganguly et al.

(10) Patent No.: US 12,588,301 B2
(45) Date of Patent: Mar. 24, 2026

(54) DETECTOR ARCHITECTURE USING PHOTODETECTOR SUBSTRATES AND SEMICONDUCTOR DEVICES

(71) Applicant: Varex Imaging Corporation, Salt Lake City, UT (US)

(72) Inventors: Arundhuti Ganguly, San Jose, CA (US); Ivan P. Mollov, Mountain View, CA (US); Richard E. Colbeth, Los Altos, CA (US)

(73) Assignee: VAREX IMAGING CORPORATION, Salt Lake City, UT (US)

( * ) Notice: Subject to any disclaimer, the term of this patent is extended or adjusted under 35 U.S.C. 154(b) by 1332 days.

(21) Appl. No.: 16/420,799

(22) Filed: May 23, 2019

(65) Prior Publication Data

US 2020/0144314 A1     May 7, 2020

Related U.S. Application Data

(60) Provisional application No. 62/755,991, filed on Nov. 5, 2018.

(51) Int. Cl.
| | |
|---|---|
| *H01L 27/146* | (2006.01) |
| *H10F 39/00* | (2025.01) |
| *H10F 39/12* | (2025.01) |
| *H10F 39/18* | (2025.01) |

(52) U.S. Cl.
CPC ......... *H10F 39/199* (2025.01); *H10F 39/011* (2025.01); *H10F 39/189* (2025.01)

(58) Field of Classification Search
CPC ................................................ H01L 27/14683

USPC .......................................................... 438/257
See application file for complete search history.

(56) References Cited

U.S. PATENT DOCUMENTS

| | | | |
|---|---|---|---|
| 5,173,443 | A | 12/1992 | Biricik et al. |
| 5,684,308 | A | 11/1997 | Lovejoy et al. |
| 7,375,341 | B1 | 5/2008 | Nagarkar |
| 7,972,885 | B1 | 7/2011 | Dutta et al. |
| 9,466,638 | B2 | 10/2016 | Vora |
| 2003/0209652 | A1 | 11/2003 | Fujii |
| 2003/0218120 | A1 | 11/2003 | Shibayama |
| 2004/0016885 | A1* | 1/2004 | Ikhlef ..................... G01T 1/202 |
| | | | 250/363.02 |
| 2006/0046350 | A1* | 3/2006 | Jiang ....................... H01L 24/13 |
| | | | 257/E21.511 |
| 2009/0224161 | A1* | 9/2009 | Fritsch .................... G02B 6/08 |
| | | | 257/E21.002 |
| 2009/0275152 | A1 | 11/2009 | Rommeveaux et al. |

(Continued)

OTHER PUBLICATIONS

Int'l Appl. No. PCT/US2018/066050, International Search Report dated Apr. 29, 2019.

(Continued)

*Primary Examiner* — Nathan W Ha
(74) *Attorney, Agent, or Firm* — Dorsey & Whitney LLP

(57) ABSTRACT

Some embodiments include a method, comprising: providing a semiconductor substrate including photodetectors on a first side of the substrate; attaching at least one semiconductor device to the first side of the semiconductor substrate; attaching a back support plate to the semiconductor substrate over the at least one semiconductor device; and thinning the semiconductor substrate.

18 Claims, 26 Drawing Sheets

(56)　　　　　　　References Cited

U.S. PATENT DOCUMENTS

| 2010/0108893 A1* | 5/2010 | Flitsch ................ H01L 27/1464 |
| | | 257/E27.14 |
| 2011/0111547 A1* | 5/2011 | Uya .................. H01L 27/14643 |
| | | 257/E31.001 |
| 2014/0367686 A1* | 12/2014 | Odnoblyudov .... H10H 20/8506 |
| | | 438/47 |
| 2015/0206917 A1 | 7/2015 | Chiu |
| 2016/0141318 A1 | 5/2016 | Van Arendonk |
| 2017/0287793 A1 | 10/2017 | Mauer et al. |
| 2018/0301496 A1* | 10/2018 | Lu ......................... H10F 39/014 |
| 2019/0122995 A1* | 4/2019 | Ko ....................... H01L 23/3135 |
| 2019/0165029 A1* | 5/2019 | Cheng ................ H01L 27/1463 |
| 2019/0198556 A1* | 6/2019 | Colbeth ................. H01L 24/33 |
| 2020/0045829 A1* | 2/2020 | Matsuura ............... H01L 23/32 |
| 2020/0286871 A1* | 9/2020 | Liff .................... H01L 21/4857 |
| 2020/0388506 A1* | 12/2020 | Hirano ................... B32B 27/34 |

OTHER PUBLICATIONS

U.S. Appl. No. 15/851,528, Response dated Sep. 17, 2018.
U.S. Appl. No. 15/851,528, Office Action dated Nov. 29, 2018.
U.S. Appl. No. 15/851,528, Response dated Mar. 29, 2019.
U.S. Appl. No. 15/851,528, Final Rejection dated May 28, 2019.
U.S. Appl. No. 15/851,528, Interview Summary dated Aug. 21, 2019.
U.S. Appl. No. 15/851,528, Response dated Aug. 27, 2019.
U.S. Appl. No. 15/851,528, Notice of Allowance dated Sep. 18, 2019.

* cited by examiner

FIG. 1A
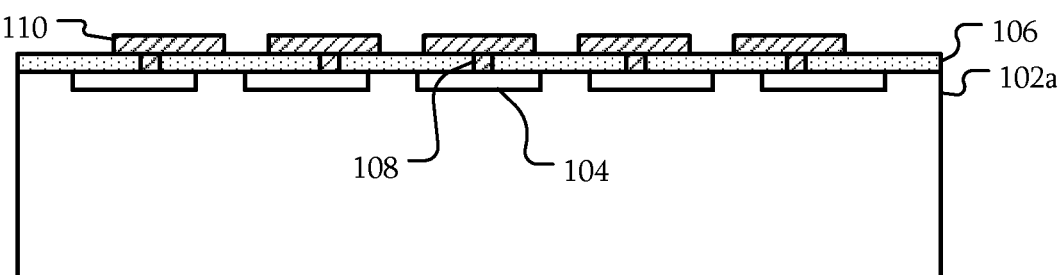
FIG. 1B
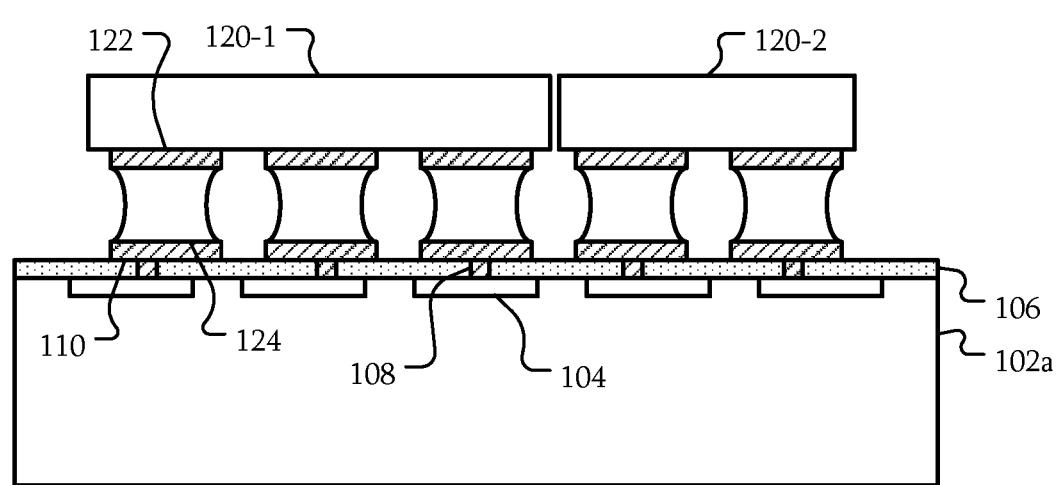
FIG. 1C

FIG. 2I

FIG. 3D
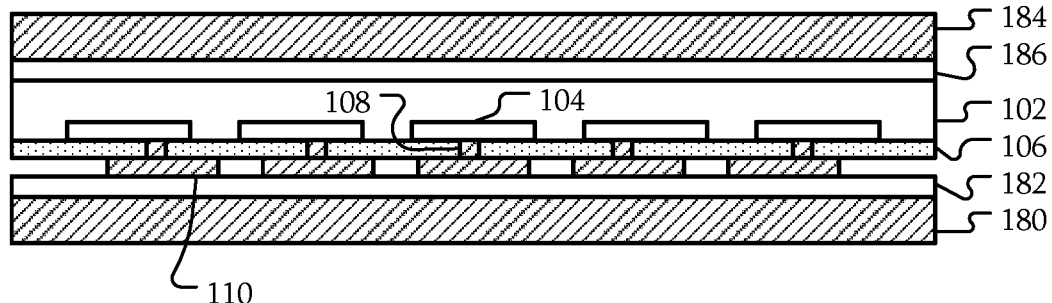
FIG. 3E
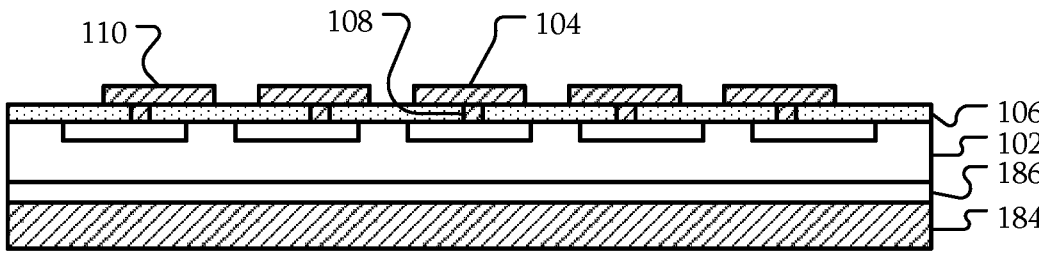
FIG. 3F

702 — X-Ray Source

720

722 — Specimen

710 — Detector

DETECTOR ARCHITECTURE USING PHOTODETECTOR SUBSTRATES AND SEMICONDUCTOR DEVICES

BACKGROUND

Back side illuminated photodetector arrays use thinned substrates. The thinned substrate reduces an effect of the substrate on radiation that passes through the substrate to the photodetectors. The thinned substrates may be on the order of 10 micrometers (μm). As a result, the thinned substrate is fragile and may break during later processing.

BRIEF DESCRIPTION OF SEVERAL VIEWS OF THE DRAWINGS

FIGS. 1A-1J are block diagrams illustrating techniques of forming a detector according to some embodiments.

FIGS. 2A-L are block diagrams illustrating techniques of forming a detector according to some other embodiments.

FIGS. 3A-I are block diagrams illustrating techniques of forming a detector according to some other embodiments.

FIG. 7 is a block diagram of a 2D x-ray imaging system according to some embodiments.

DETAILED DESCRIPTION

This disclosure relates to detector architectures using photodetector substrates and semiconductor devices and, in particular, such detector architectures using thinned photodetector substrates. In some embodiments, a backside illuminated detector may include a substrate that has been thinned. The thinning reduces an amount of the substrate that incident radiation must penetrate to reach photodetectors disposed on a front side of the substrate. As a result, losses due to the substrate may be reduced. However, such thinning reduces the structural integrity of the substrate. For example, the substrate may be thinned to a thickness of about 10 μm. The original substrate may have a width that is 20 cm or a factor of 20000 greater than the thickness of the thinned substrate. As a result, the substrate may be relatively fragile. As will be described in further detail below, a back support plate may provide structural support for such a substrate.

Figure 1D:
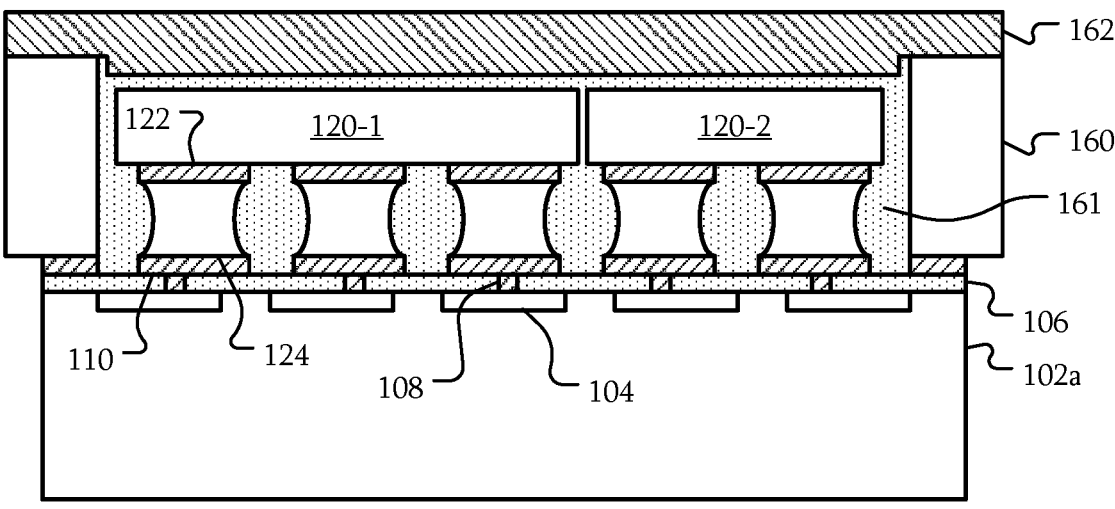

FIGS. 1A-1J are block diagrams illustrating techniques of forming a detector according to some embodiments. Referring to FIG. 1A, a semiconductor substrate 102a is provided. The semiconductor substrate 102a may include silicon, amorphous silicon, glass, another substrate on which semiconductor devices may be formed, or the like.

The semiconductor substrate 102a includes multiple photodetectors 104. The photodetectors 104 are semiconductor structures configured to convert incident photons into electrons, current, voltage, or the like. For example, the photodetectors 104 may include photodiodes, photo transistors, or the like. Although a particular number of photodetectors 104 has been used as an example, in other embodiments the number may be different. Moreover, although photodetectors 104 have been illustrated in a line, the photodetectors 104 may be disposed in a variety of configurations. For example, the photodetectors 104 may be disposed in an array, such as two-dimensional (2D) array.

The photodetectors 104 may be formed on or in the semiconductor substrate 102a. Here, the photodetectors 104 are illustrated as being formed in the semiconductor substrate 102a; however, in other embodiments, the photodetectors 104 may be formed differently. An isolation layer 106 is disposed on a surface of the semiconductor substrate 102a. The isolation layer 106 can include an electrically insulative material, such as an oxide (02). A plurality of vias 108 in the isolation layer 106 electrically connect the photodetectors 104 to pads 110 formed on the semiconductor substrate 102a. The vias 108 and pads 110 may include conductive materials such as metal, polysilicon, or the like.

Although the semiconductor substrate 102a has been described as having a particular structure with photodetectors 104 connected to pads 110 through vias 108, in other embodiments, the structure of the semiconductor substrate 102a may be different. For example, one or more wiring layers, other circuits and components, or the like may be formed in or on the semiconductor substrate 102a.

As will be described in further detail below, the semiconductor substrate 102a may be thinned. Before thinning, the semiconductor substrate 102a may have a thickness that is about 500 μm to about 800 μm or about 50 times to about 80 times greater than the thickness of the thinned substrate. Although a particular example has been used, in other embodiments, the thickness of the semiconductor substrate 102a may be different.

Referring to FIG. 1B, in some embodiments, one or more semiconductor devices 120 are attached to the semiconductor substrate 102a. Here, two semiconductor devices 120-1 and 120-2 are used as examples; however, in other embodiments, one semiconductor device 120 to any number of semiconductor devices 120, such as hundreds or more discrete semiconductor devices 120, may be attached to the semiconductor substrate 102a.

In some embodiments, a semiconductor device 120 is attached to the semiconductor substrate 102a by soldering pads 110 of the semiconductor substrate 102a to pads 122 of the semiconductor device 120 using solder 124. In other embodiments, the semiconductor device 120 may be attached to the semiconductor substrate 102a using other attachment techniques, such as by using an anisotropic conductive film (ACF). The ACF can include an anisotropic conductive paste (ACP), an anisotropic conductive adhesive (ACA), or the like.

A semiconductor device 120 may be any variety of semiconductor chip that may be electrically connected to the semiconductor substrate 102a and the circuits therein. For example, the semiconductor device 120 may include readout circuits, amplifier circuits, row/column selection circuits, signal routing circuits, image processing circuits, a system-on-a-chip (SOC), or the like. One or more of such circuits may be configured to receive a signal from one or more of the photodetectors 104.

When multiple semiconductor devices 120 are present, the semiconductor devices 120 may be separate from each other and, consequently, may not provide structural support. However, at this stage of the process, the semiconductor substrate 102a still has a thickness that may provide structural support for subsequent processing. As a result, another support structure may not be needed at this time. However, once the semiconductor substrate 102a is thinned, additional support may be used.

In some embodiments, a detector may be formed using the photodetectors 104 of the semiconductor substrate 102a, such a detector may benefit from having multiple smaller semiconductor devices 120 rather than a single semiconductor device 120. For example, if the semiconductor substrate 102*a* has a size that is on the order of the size of a wafer (e.g., 25 millimeters [mm; ≈1 inch] diameter to 450 mm [≈17.7 inch] diameter), a similarly sized single semiconductor device 120 may be needed to provide circuitry for all of the photodetectors 104 of wafer-sized substrate 102*a*. If that wafer-sized single semiconductor device 120 fails, another wafer-sized single semiconductor device 120 would be needed. However, with multiple chips, each semiconductor device 120 may be smaller. The entire wafer-sized semiconductor device 120 need not be discarded if it fails, only the failed smaller semiconductor device 120, which can improve the overall yield of manufactured detectors.

Referring to FIG. 1C, a connection structure 160 is attached to the semiconductor substrate 102*a*. An example of the connection structure 160 is a physical connection structure such as an interposer 160-1. The interposer 160-1 may include a structure that follows or is positioned on a perimeter of the semiconductor substrate 102*a*. The interposer 160-1 may be disposed around one or all of the semiconductor devices 120. Although illustrated on the perimeter, the interposer 160-1 may also include portions disposed inside of the perimeter and possibly between semiconductor devices 120, include such interior portions and exclude portions along the perimeter, or the like. The interposer 160-1 may be attached to pads 110 of the semiconductor substrate 102*a*. In some embodiments, the interposer 160-1 may be attached to the pads 110 by an adhesive, such as a glue, an epoxy, an ACF, or the like; however, in other embodiments, different techniques may be used to attach the interposer 160-1 such as using solder similar to solder 124, or the like. The interposer 160-1 may extend from the semiconductor substrate 102*a* to extend further from the semiconductor substrate 102*a* than the semiconductor devices 120. That is, a height of the interposer 160-1 from the surface of the semiconductor substrate 102*a* may be greater than a height of the semiconductor devices 120.

As will be described in further detail below, the interposer 160-1 may form a structural connection between a back support plate 162 and the semiconductor substrate 102*a*. Accordingly, in some embodiments, the interposer 160-1 may be formed of a rigid material such as metal, plastic, glass, ceramic, or the like.

In other embodiments, an electrical connection structure 160-2 may be attached to the semiconductor substrate 102*a*. The electrical connection structure 160-2 may include a structure that may electrically couple circuitry, wiring, or the like on the semiconductor substrate 102*a* to an external device or system. In some embodiments, the electrical connection structure 160-2 may provide an electrical connection to one or more of the semiconductor devices 120. Examples of the connection structure 160-2 include a flexible cable, a printed circuit board, another substrate with electrical wirings and/or components, or the like.

In some embodiments, only an interposer 160-1 is present. However, in other embodiments, an electrical connection structure 160-2 may be attached to the semiconductor substrate 102*a* in addition to or in place of an interposer 160-1. In some embodiments, the interposer 160-1 may include electrical connections that function as a connection structure 160-2. For ease of illustration, the interposer 160-1 will be illustrated as the example of the connection structure 160 in later figures.

Referring to FIG. 1D, in some embodiments, a back support plate 162 is attached to the semiconductor substrate

102*a* over the at least one semiconductor device 120. The back support plate 162 may include a plate that is large enough to cover at least the semiconductor devices 120. In some embodiments, the back support plate 162 covers at least part of the connection structure 160. In some embodiments, the back support plate 162 contacts the connection structure 160. The back support plate 162 may include a rigid material such as metal, glass, plastic, ceramic, or the like.

In some embodiments, an underfill material 161 may be used to fill the space between the semiconductor substrate 102*a* and the back support plate 162. The underfill material 161 may also fill a space between the semiconductor devices 120 and the semiconductor substrate 102*a*. The underfill material 161 may include an epoxy, a glue, a polymer, or the like. In some embodiments, the underfill material 161 acts as an adhesive that attaches the back support plate 162 to the semiconductor substrate 102*a*.

Figure 1E:
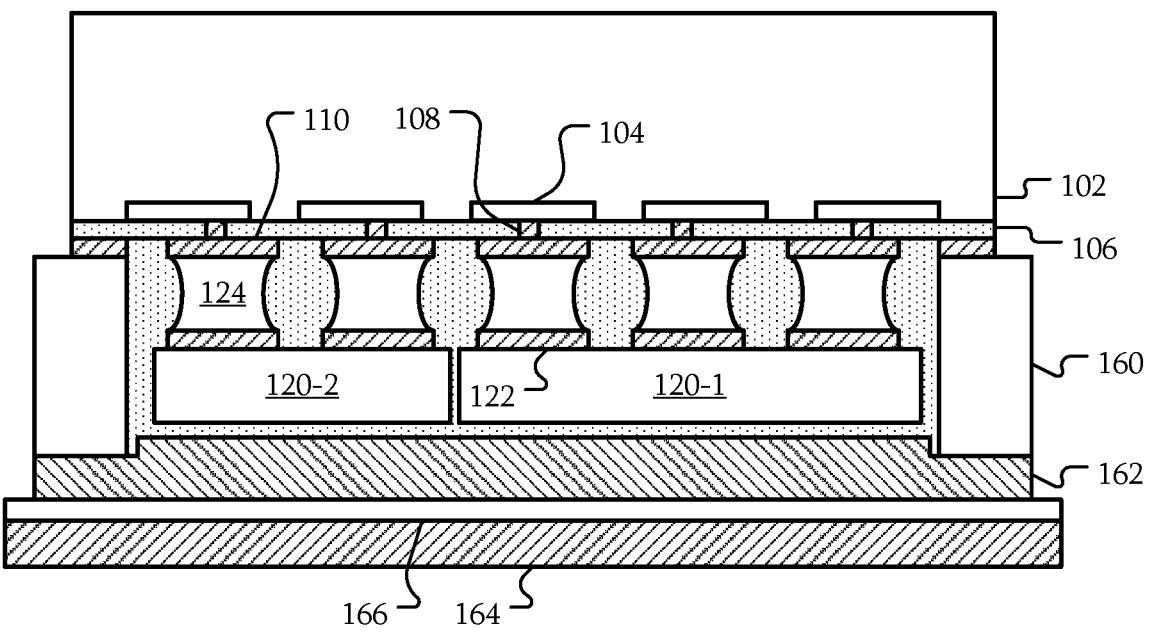

Referring to FIG. 1E, the back support plate 162 is attached to a carrier substrate 164. The carrier substrate 164 may include a chuck, another wafer, a plate, or the like. Here, the back support plate 162 is attached to the carrier substrate 164 using an adhesive 166. The adhesive 166 may be a releasable adhesive. In FIG. 1E, the structure including the semiconductor substrate 102*a* is inverted relative to that in FIG. 1D. However, in other embodiments, the orientation may be different.

Figure 1F:
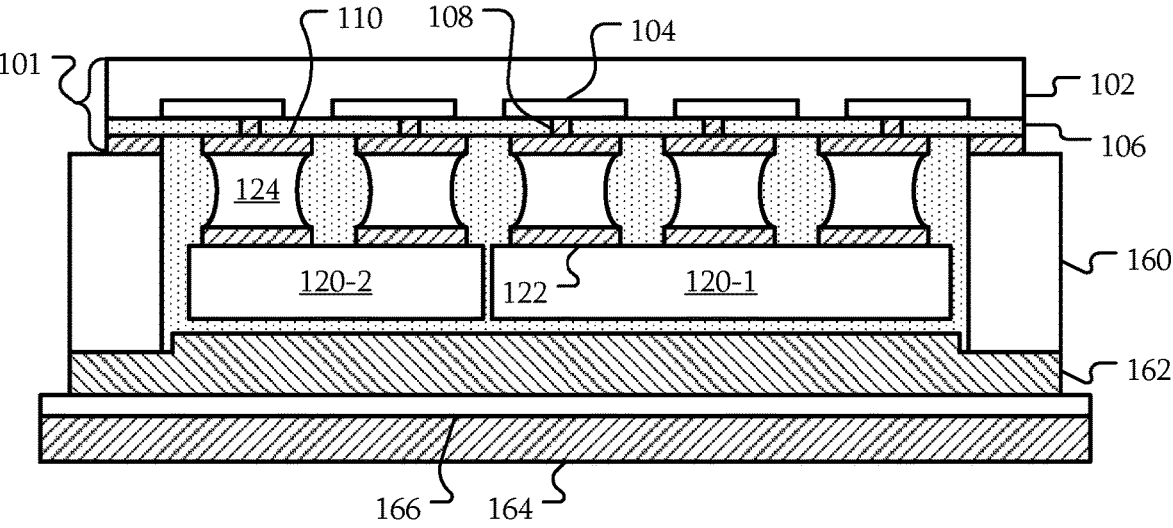

Referring to FIG. 1F, the semiconductor substrate 102*a* is thinned to form the thinned substrate 102. For example, the semiconductor substrate 102*a* may be thinned by grinding, chemical mechanical polishing (CMP), etching, or the like. The semiconductor substrate 102*a* may be reduced in thickness to a desired thickness for the thinned substrate 102. In a particular example, the semiconductor substrate 102*a* may have a thickness from about 500 μm to about 800 μm. The thickness of the thinned substrate 102 after thinning may be tens of μm or less, such as 10 μm or less or 30 μm or less. The thickness of the thinned substrate 102 after thinning may be 15 times less to 80 times less than the starting semiconductor substrate 102*a* thickness. The semiconductor substrate 102*a* may be thinned to a thickness such that the transmittance through the thinned substrate 102 to the photodetectors 104 is greater than a threshold. For example, the threshold may be 50%, 80%, or a different amount. The transmittance may be the transmittance over a wavelength range that the photodetectors 104 operate.

In some embodiments, the side of the thinned substrate 102 opposite to the photodetectors 104 is planar. As a result, a variation across the thinned substrate 102 in the light incident on the photodetectors 104 may be reduced or eliminated. For example, the thinned substrate 102 may absorb some of the incident radiation. The amount absorbed may depend on the thickness of the thinned substrate 102. If the thinned substrate 102 is planar, a variation in the amount of the thinned substrate 102 through which the incident radiation passes through to the photodetectors 104 may be reduced or eliminated and, consequently, the variation in absorption of the incident radiation may be reduced or eliminated. As used herein, planar is flat within manufacturing tolerances of the process used to planarize and/or thin the thinned substrate 102. As a result, planar may include some variation in the surface within those tolerances.

The use of a thinned substrate 102 allows for a higher detected quantum efficiency (DQE). Because the thinned substrate 102 is thinned, and in particular, thinned past a point where its structure alone cannot support subsequent processing without damage, an amount of light absorbed by the thinned substrate 102 is reduced. As a result, the amount of the incident radiation reaching the photodetectors 104 is increased.

Figure 1G:
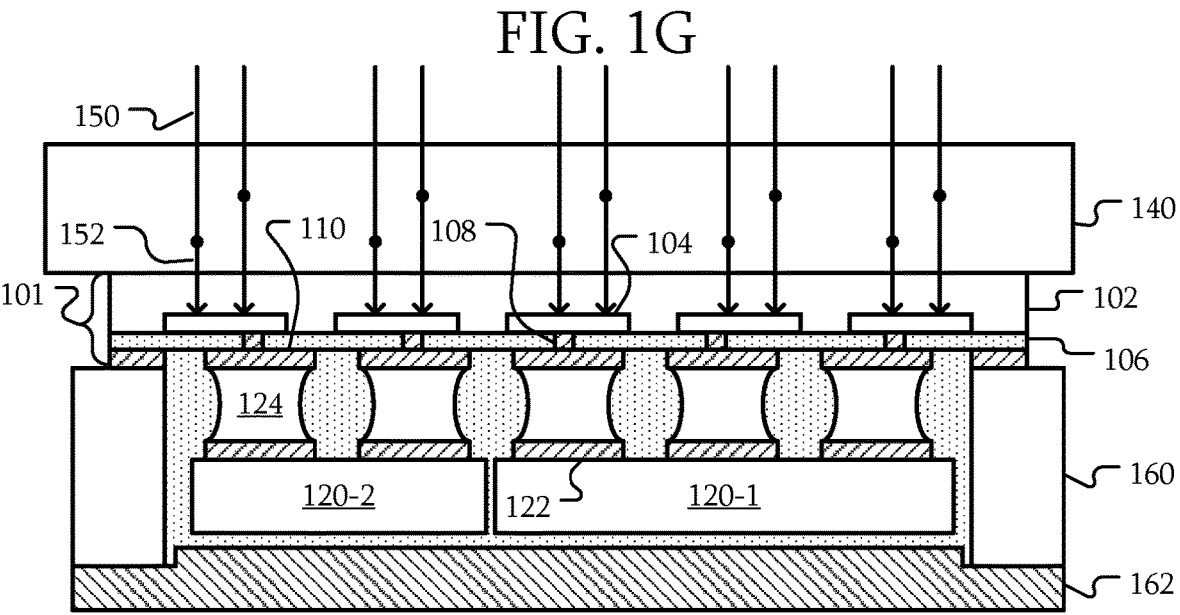

Referring to FIG. 1G, in some embodiments, a scintillator 140 is attached to the thinned substrate 102. The scintillator 140 includes a material that converts radiation of one wavelength to another. For example, in some embodiments, the scintillator 140 includes a luminescent or scintillation material which generates visible or near-visible light when excited by ionizing or incoming radiation 150, such as x-rays (i.e., converts incoming x-ray photons to light photons 152). For example, the scintillator 140 may include cesium iodide (CsI), gadolinium oxysulfide (GOS or Gd₂O₂S), or other materials that may convert an incoming radiation 150 into a wavelength that is more readily detected by the photodetectors 104.

The scintillator 140 may be attached to the thinned substrate 102 in a variety of ways. For example, lamination, direct deposition, evaporation, compression, adhesion, or the like may be used to attach and/or form the scintillator 140 on the thinned substrate 102.

Figure 1H:
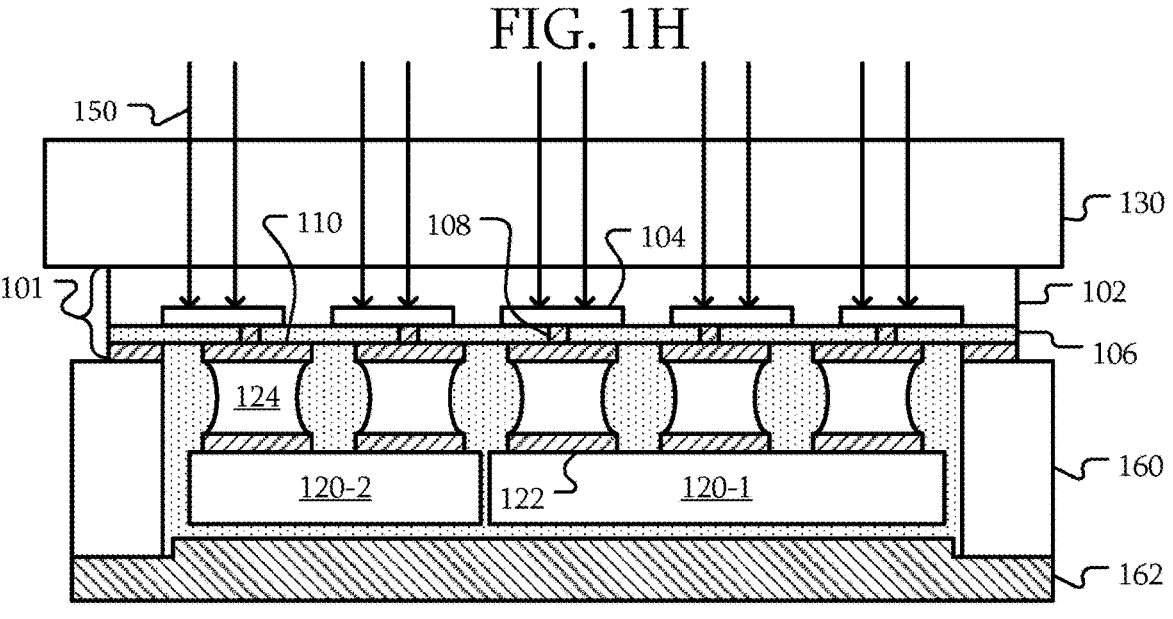

Referring to FIG. 1H, in some embodiments, an optical substrate 130 is attached to the thinned substrate 102. The optical substrate 130 is a substrate that is configured to allow incoming radiation 150 to reach the thinned substrate 102 and hence, the photodetectors 104. In some embodiments, the optical substrate 130 may include a fiber optic plate. In other embodiments, the optical substrate 130 may include a microlens array, a lenticular lens, an optically transparent material such as glass or a transparent ceramic, an optical filter, or the like. In other examples, the optical substrate 130 may be an optical grid or other light channeling structure. In some embodiments, the optical substrate 130 may have a particular density or other characteristic that allows the optical substrate 130 to have a sufficient transmittance of the incident radiation while still having a sufficient structure to support the thinned substrates 102 through manufacturing and use. Accordingly, while the back support plate 162 may support the thinned substrate 102, the optical substrate 130 may provide additional support. The optical substrate 130 may be different than the specific examples listed above.

In some embodiments, an adhesive is used to attach the optical substrate 130 to the thinned substrate 102. An adhesive is applied to the thinned substrate 102 and/or the optical substrate 130. The thinned substrate 102 and the optical substrate 130 are moved into contact and the adhesive is cured. In other embodiments, other techniques may be used to attach the optical substrate 130 to the thinned substrate 102. For example, the thinned substrate 102 may be laminated or otherwise bonded to the optical substrate 130.

Figure 1I:
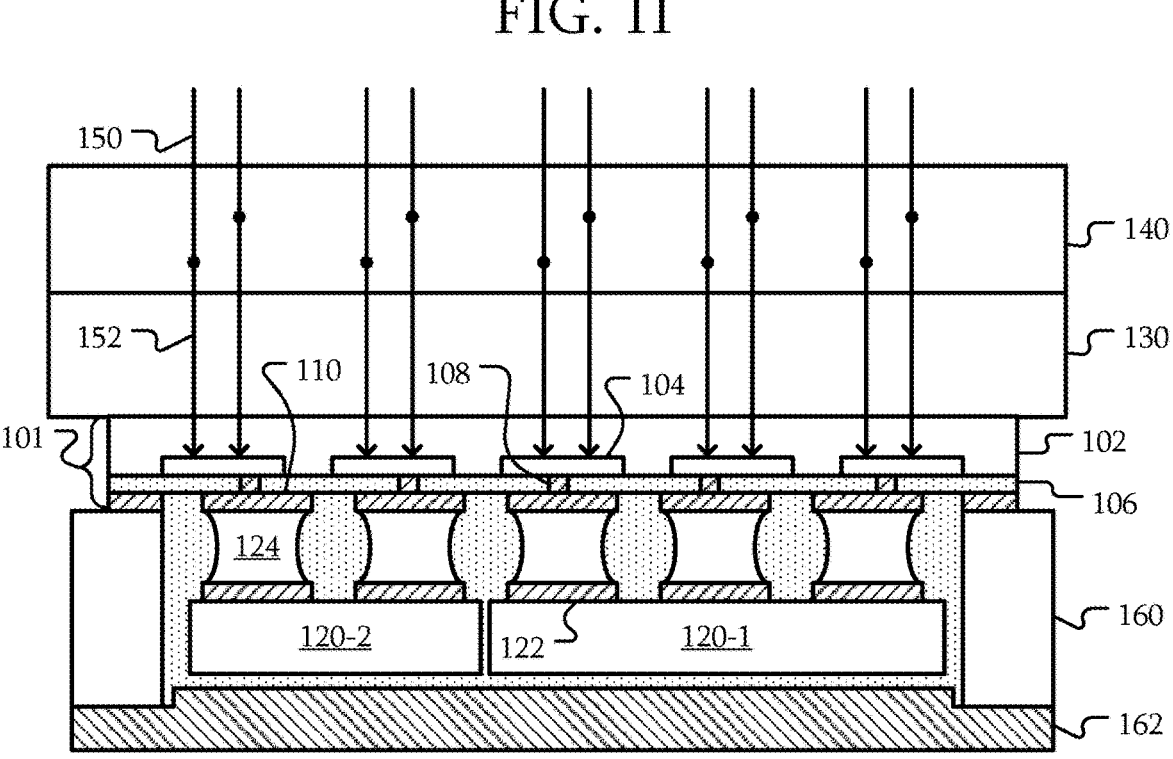

Referring to FIG. 1I, in some embodiments, the scintillator 140 may be attached to the optical substrate 130. The scintillator 140 may be attached to the optical substrate 130 in a variety of ways. For example, lamination, direct deposition, compression, adhesion, or the like may be used to attach and/or form the scintillator 140 on the optical substrate 130. In some embodiments, the scintillator 140 may be attached to the optical substrate 130 before the optical substrate 130 is attached to the thinned substrate 102.

Although a separate scintillator 140 has been used as an example, in some embodiments, a scintillating material may be combined with the optical substrate 130. For example, the optical substrate 130 may be a fiber optic plate with scintillating material within the individual fibers.

After the procedures in each of FIGS. 1F-I, the carrier substrate 164 may be removed. Accordingly, a detector may be formed using a thinned substrate 102 where further processing of the detector may be performed after thinning the semiconductor substrate 102a.

Figure 1J:
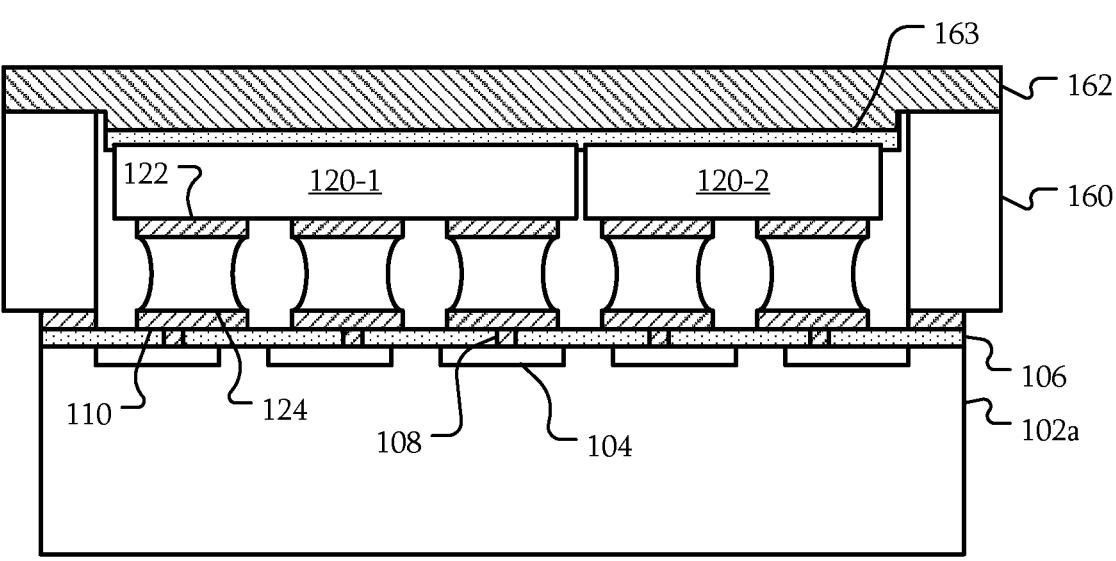

Referring to FIG. 1J, in some embodiments, the back support plate 162 may be attached to the semiconductor devices 120 in ways different from that in FIG. 1D. For example, a sheet glue 163 may be applied to one or both of the back support plate 162 and the semiconductor devices 120. The back support plate 162 and the semiconductor devices 120 may be attached using the sheet glue 163. The processing following FIG. 1D may be performed on the structure of FIG. 1J.

In some embodiments, the sheet glue 163 may extend past the semiconductor devices 120. In some embodiments, the sheet glue 163 may contact the connection structure 160. The processing following FIG. 1D may be performed on the structure of FIG. 1J.

Figure 2A:
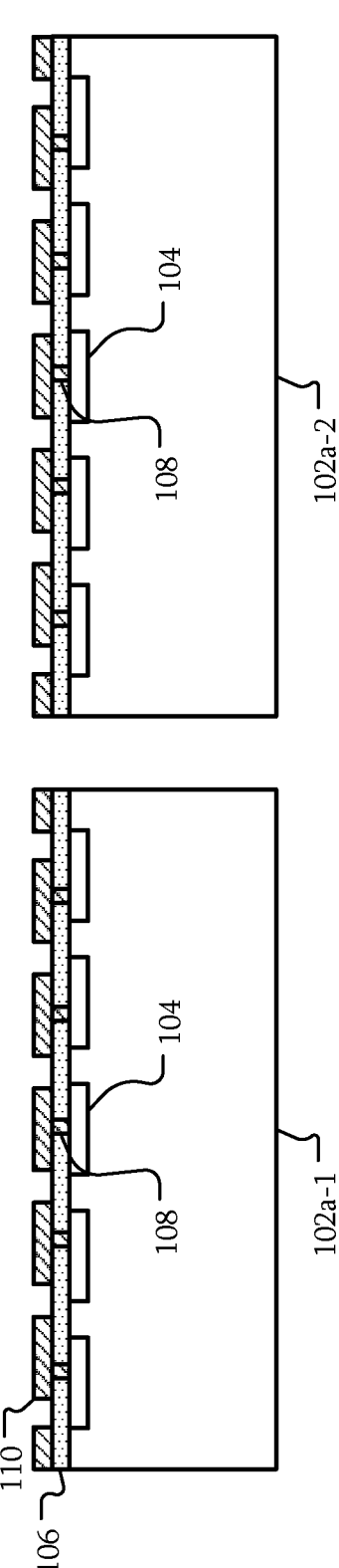

FIGS. 2A-K are block diagrams illustrating techniques of forming a detector according to some other embodiments. Referring to FIG. 2A, in some embodiments, multiple semiconductor substrates 102a similar to those described above are provided. Here, two semiconductor substrates 102a-1 and 102a-2 are used as examples, however, in other embodiments, more semiconductor substrates 102a may be present. The semiconductor substrates 102a may be identical, similar, or different.

Figure 2B:
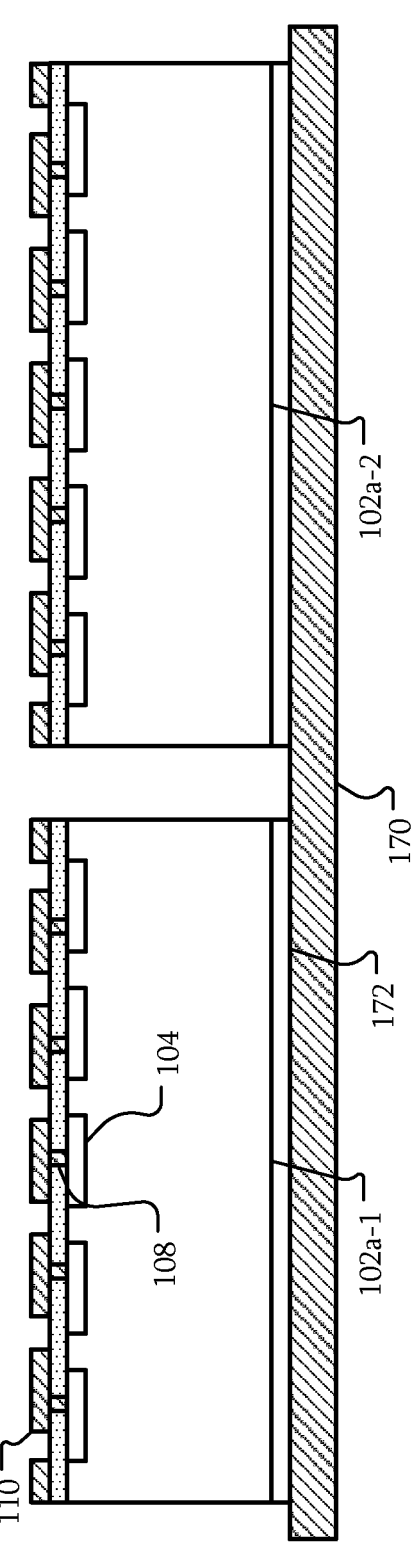

Referring to FIG. 2B, in some embodiments, the semiconductor substrates 102a are attached to a carrier substrate 170. Similar to the carrier substrate 164, the carrier substrate 170 may include a chuck, another wafer, a plate, or the like. In some embodiments, the carrier substrate 170 may include a material that may be removable in a process used to thin the semiconductor substrate 102a. The semiconductor substrates 102a may be attached to the carrier substrate 170 using an adhesive 172. In some embodiments, the adhesive 172 may be a sheet glue.

In some embodiments, the carrier substrate 170 may include an optically flat plate. An optically flat plate may include a variation across the surface that is less than a fraction of wavelength of light. As a result, during subsequent processing, the surfaces of the semiconductor substrates 102a may remain substantially aligned within the tolerance of the height of the semiconductor substrates 102a during the manufacturing process.

Figure 2C:
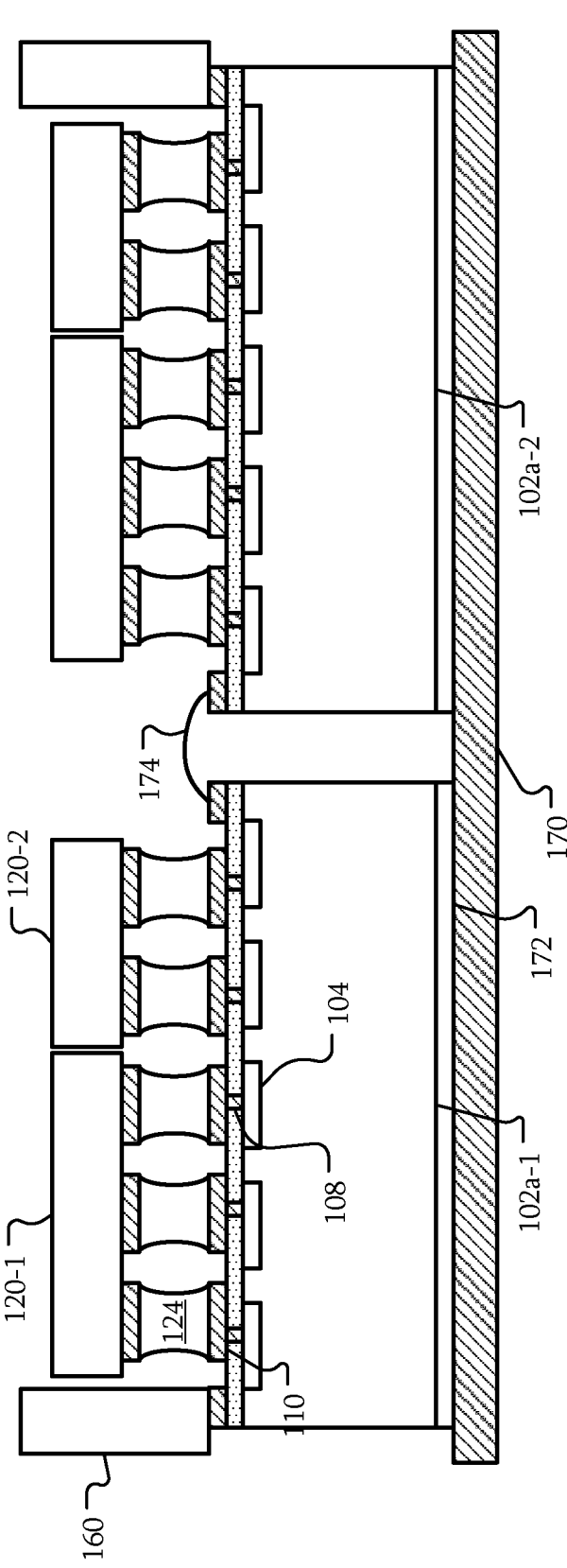

Referring to FIG. 2C, in some embodiments, at least one semiconductor device 120 is attached to one or more of the semiconductor substrates 102a. The at least one semiconductor device 120 may be attached to the corresponding semiconductor substrate 102a as described above with respect to FIG. 1B.

In some embodiments, each of the semiconductor substrates 102a is attached to at least one semiconductor device 120. Here, multiple semiconductor devices 120 are attached; however, in other embodiments, a different number of semiconductor devices 120 may be attached to the semiconductor substrates 102a as described with respect to FIG. 1B. In some embodiments and as illustrated, each of the semiconductor substrates 102a is attached to the same number, type, and configuration of multiple semiconductor devices 120. In other embodiments, the number, type, configuration, or the like of semiconductor devices 120 that are attached to each semiconductor substrate 102a may be different.

In addition, an interposer and/or connection structure 160 is attached to the semiconductor substrates 102a. In some embodiments, the interposer and/or connection structure 160 are attached as described above in FIG. 1C. In some embodiments, the interposer and/or connection structure 160 is attached to regions of the semiconductor substrates 102*a* along the perimeter of the structure.

In some embodiments, an electrical connection is formed between one of the semiconductor substrates 102*a* and another of the semiconductor substrates 102*a*. For example, a bond wire 174 may electrically connect semiconductor substrates 102*a*-1 and semiconductor substrates 102*a*-2. Although a bond wire 174 is used as an example of an electrical connection formed between semiconductor substrates 102*a*, in other embodiments, different structures may electrically connect the semiconductor substrates 102*a* such as bond ribbon, a flexible cable, or the like.

Figure 2D:
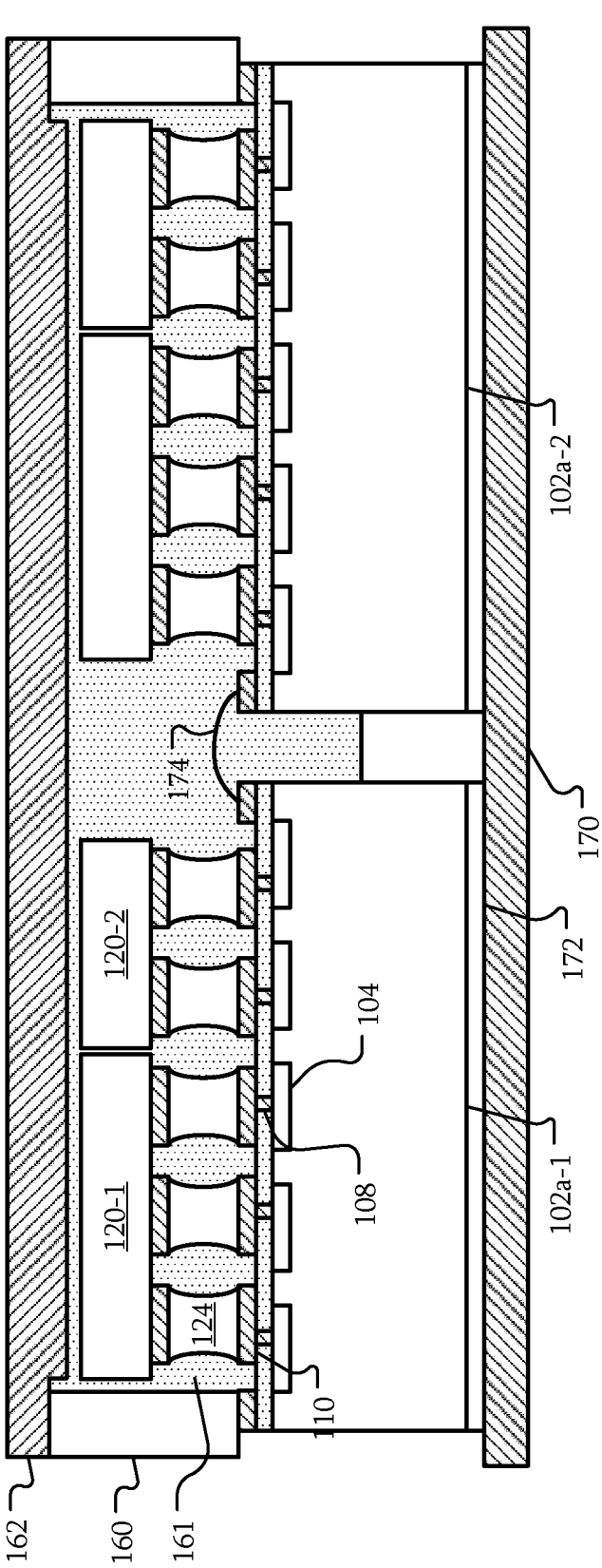

Referring to FIG. 2D, in some embodiments, a back support plate 162 may be attached to the semiconductor substrates 102*a* over the semiconductor devices 120. The back support plate 162 may be attached similar to the back support plate 162 described in FIG. 1D.

In some embodiments, an underfill material 161 may also be used to fill the space between the semiconductor substrates 102*a* and the back support plate 162 similar to the underfill material 161 described in FIG. 1D. The underfill material 161 may also fill a space between the semiconductor substrates 102*a*. The underfill material 161 may encapsulate the electrical connections between the semiconductor substrates 102*a* such as the bond wire 174. In some embodiments, the underfill material 161 may extend to the carrier substrate 170; however, in other embodiments, the underfill material 161 may extend less than all of the way to the carrier substrate 170. For example, the underfill material may extend to beyond a location on the semiconductor substrates 102*a* will be thinned to such that the underfill material is also thinned to the same level.

Figure 2E:
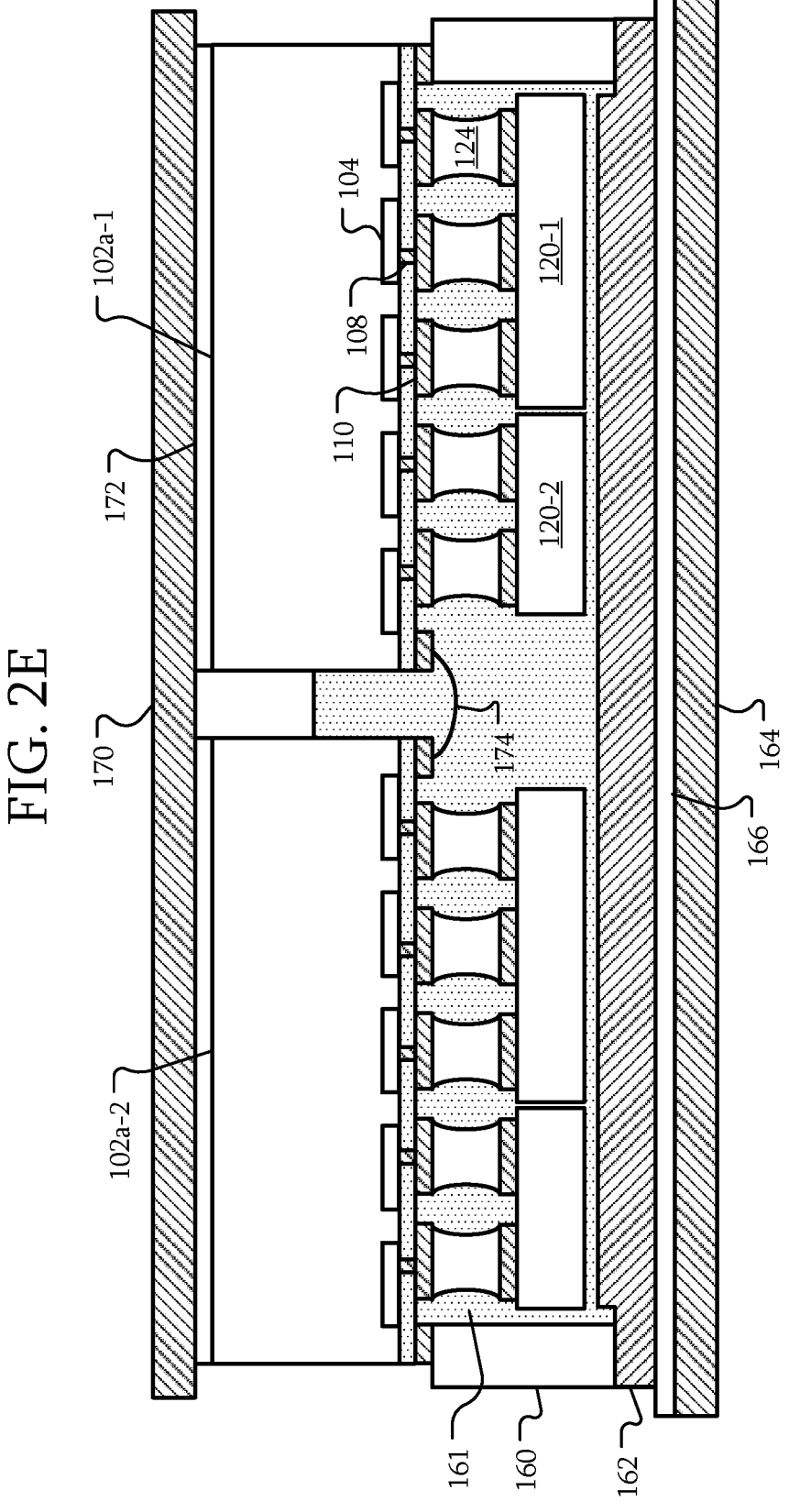

Referring to FIG. 2E, the back support plate 162 is attached to another carrier substrate 164. The attachment may be similar to that described in FIG. 1E.

Figure 2F:
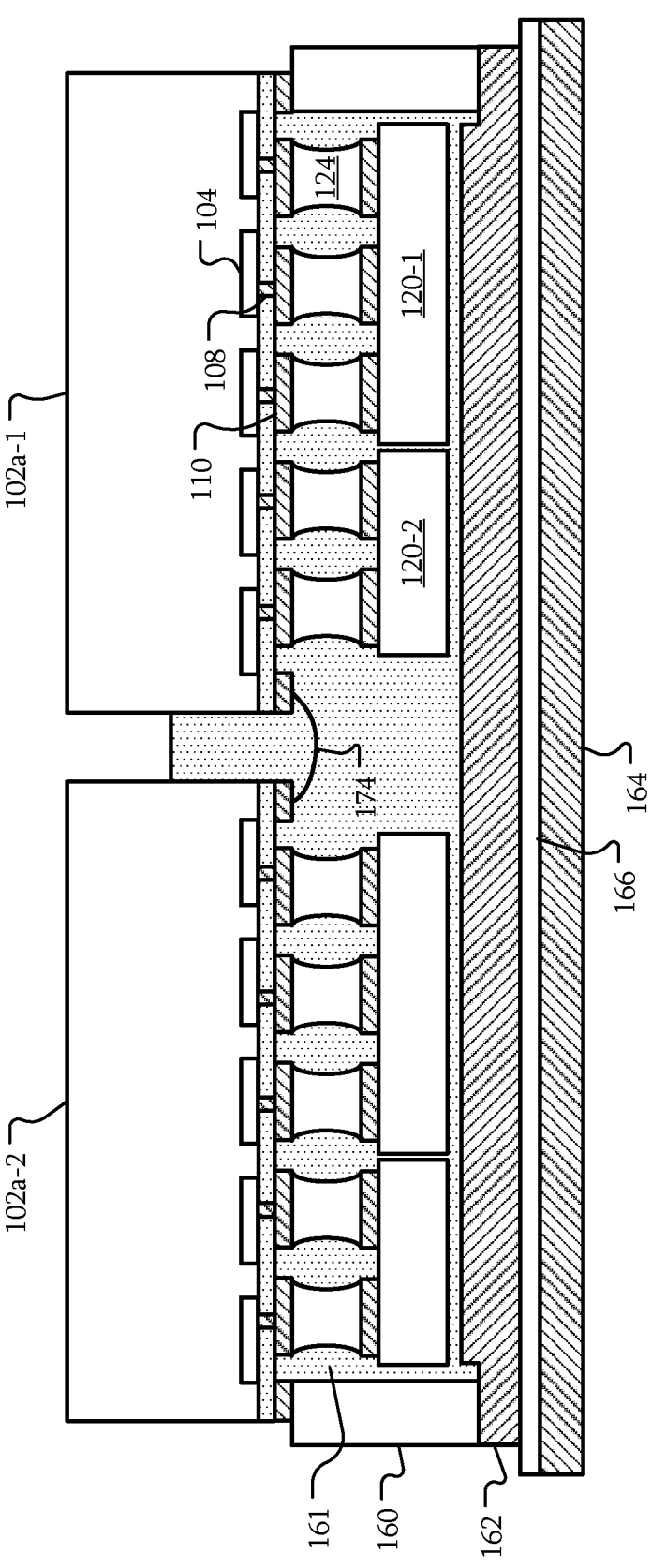
Figure 2G:
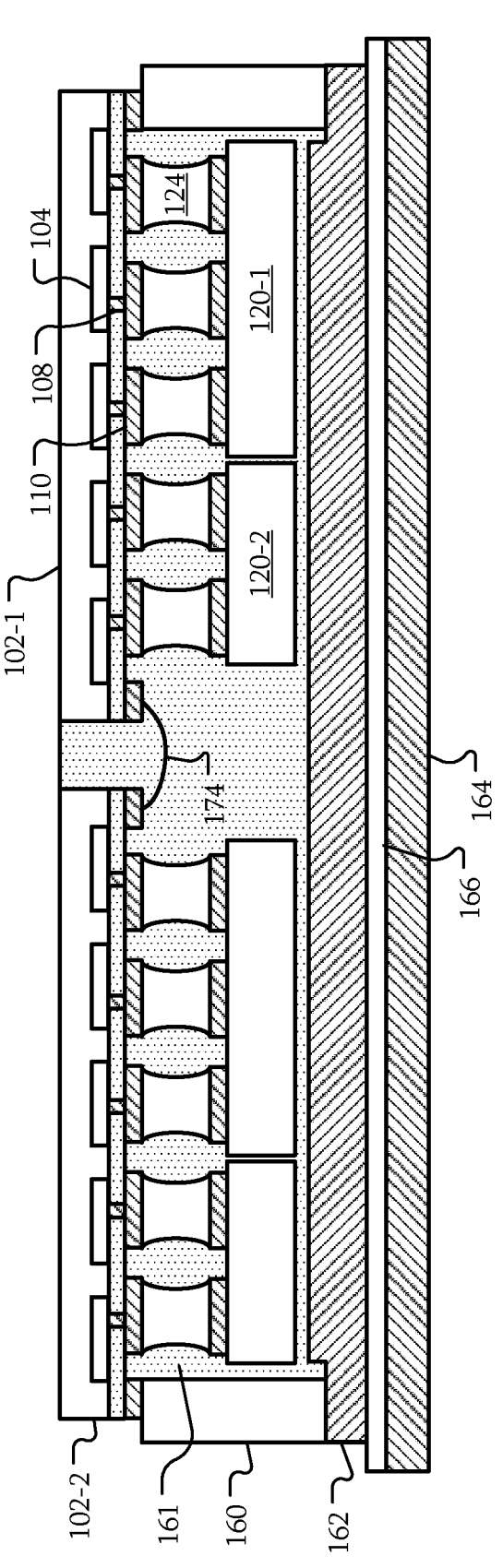

Referring to FIG. 2F, in some embodiments, the carrier substrate 170 is removed from the semiconductor substrates 102*a*-1 before further processing. Referring to FIG. 2G, the semiconductor substrates 102*a* are thinned similar to the semiconductor substrate 102*a* described in FIG. 1F. In some embodiments, the carrier substrate 170 of FIG. 2E may not be removed as a separate step and may instead be removed during the thinning process resulting in substantially the same structure as if the carrier substrate 170 was removed.

Figure 2H:
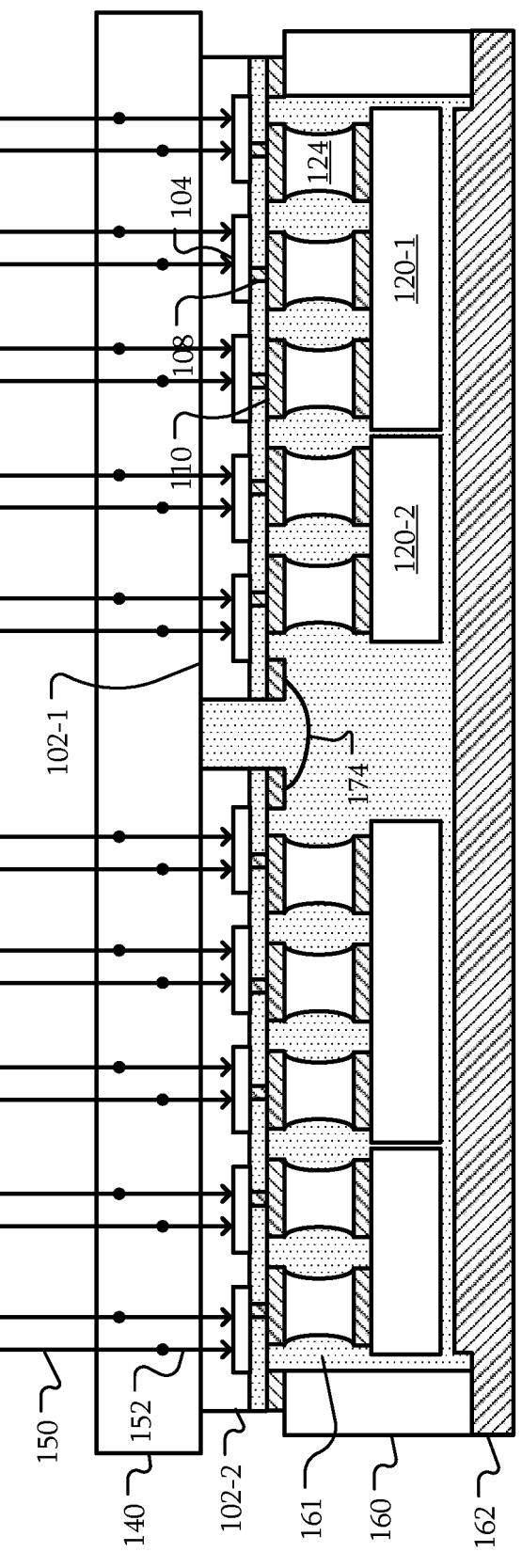
Figure 2I:
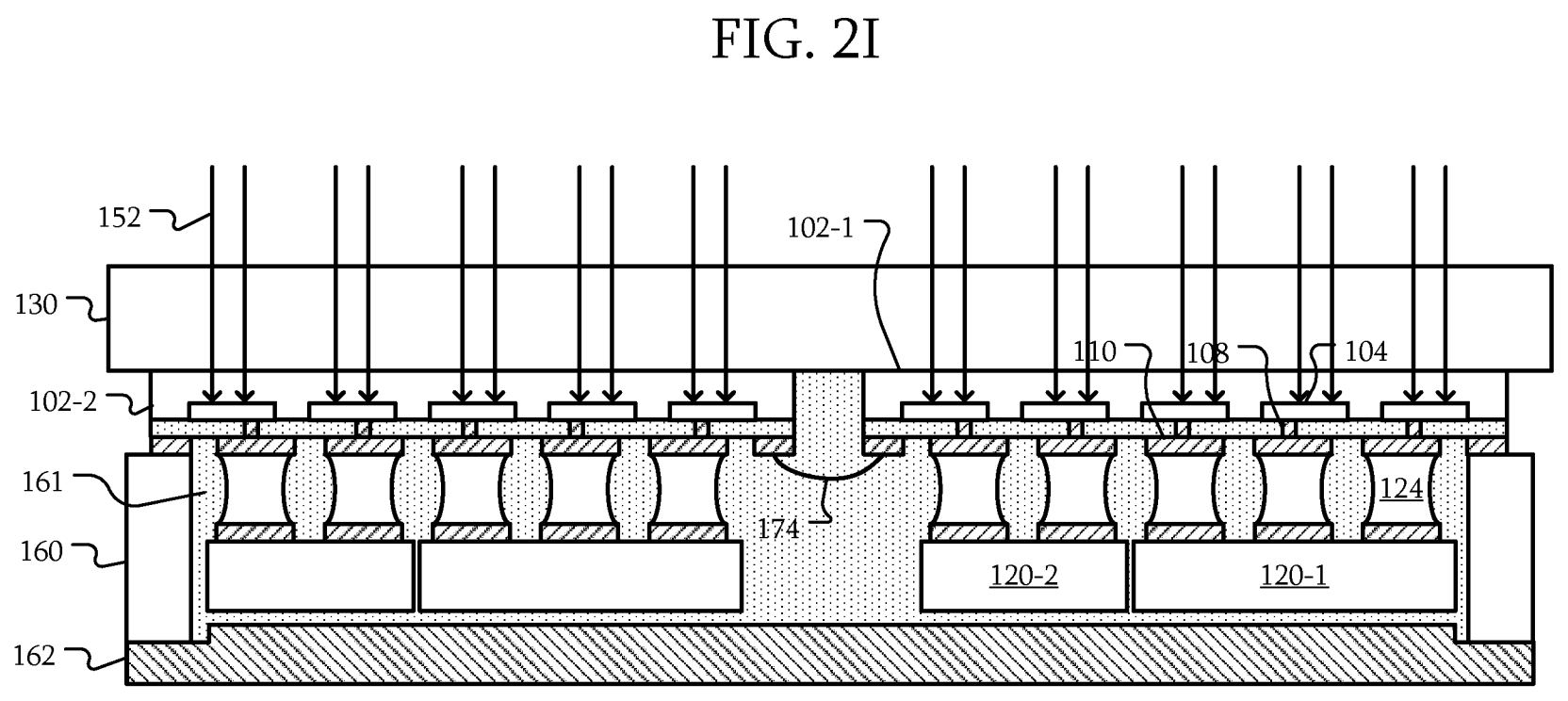
Figure 2J:
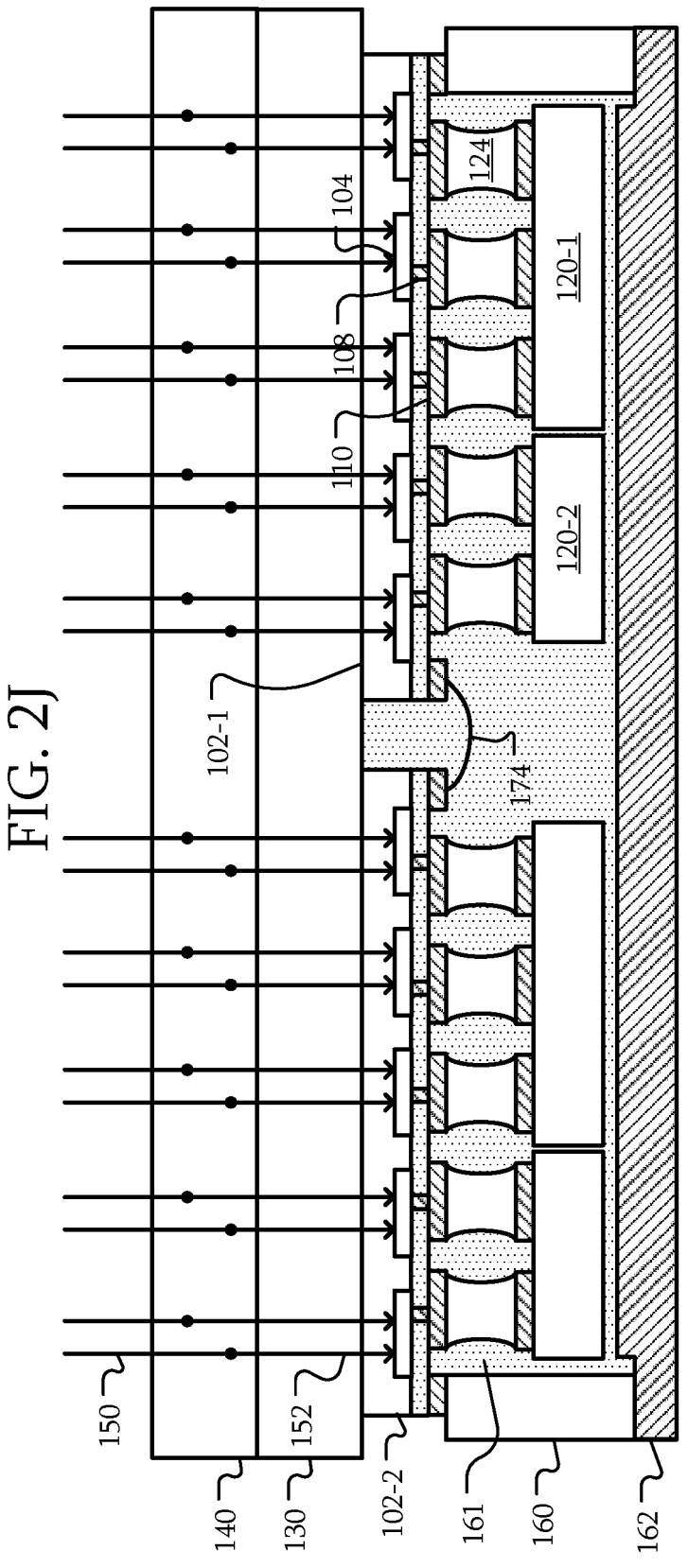

Referring to FIGS. 2H-J, in some embodiments, an optical substrate 130 and/or a scintillator 140 may be attached similar to those in FIGS. 1G-I. Similarly, the assembly may be removed from the carrier substrate 164.

Figure 2K:
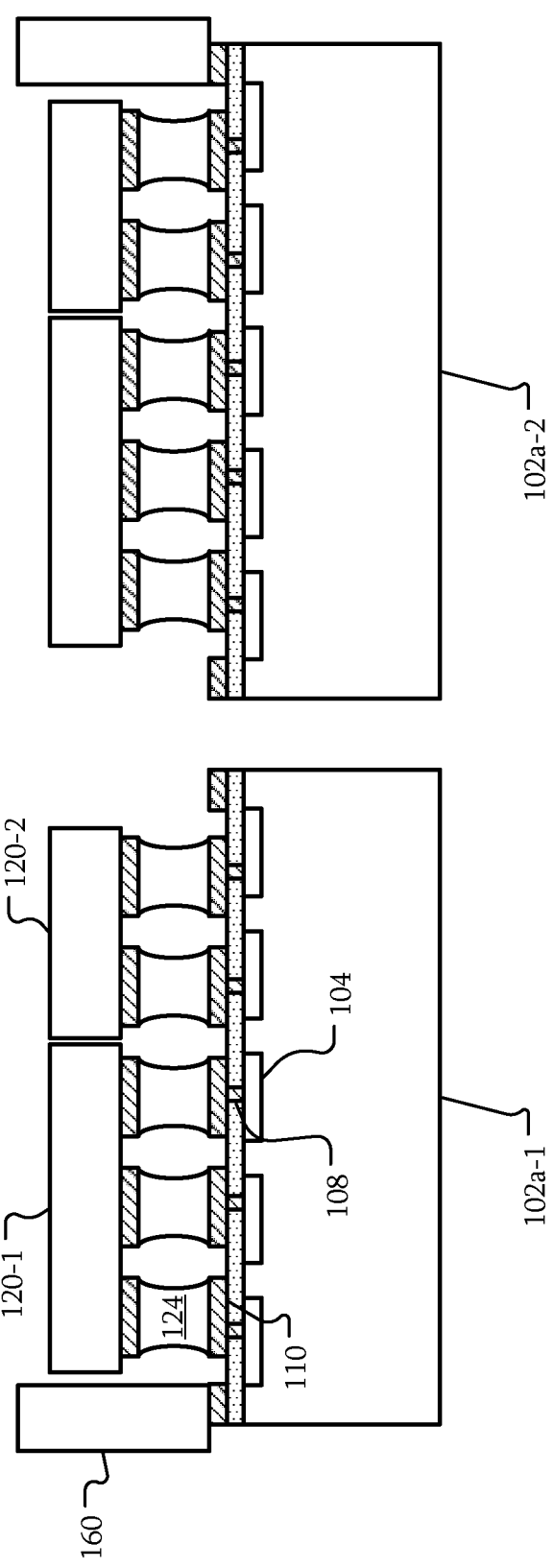

Referring to FIG. 2K, in some embodiments, the semiconductor substrates 102*a* of FIG. 2A may be prepared differently before being attached to the carrier substrate 170 as described in FIG. 2C. For example, the semiconductor devices 120 and the connection structure 160 may be attached to individual semiconductor substrates 102*a* similar to the process described in FIG. 2C but before those semiconductor substrates 102*a* are attached to the carrier substrate 170. The intermediate structures of the FIG. 2K may then be attached to the carrier substrate 170 resulting in a structure similar to that of FIG. 2C. Other similar operations may be performed as described in FIGS. 2D-J.

Figure 2L:
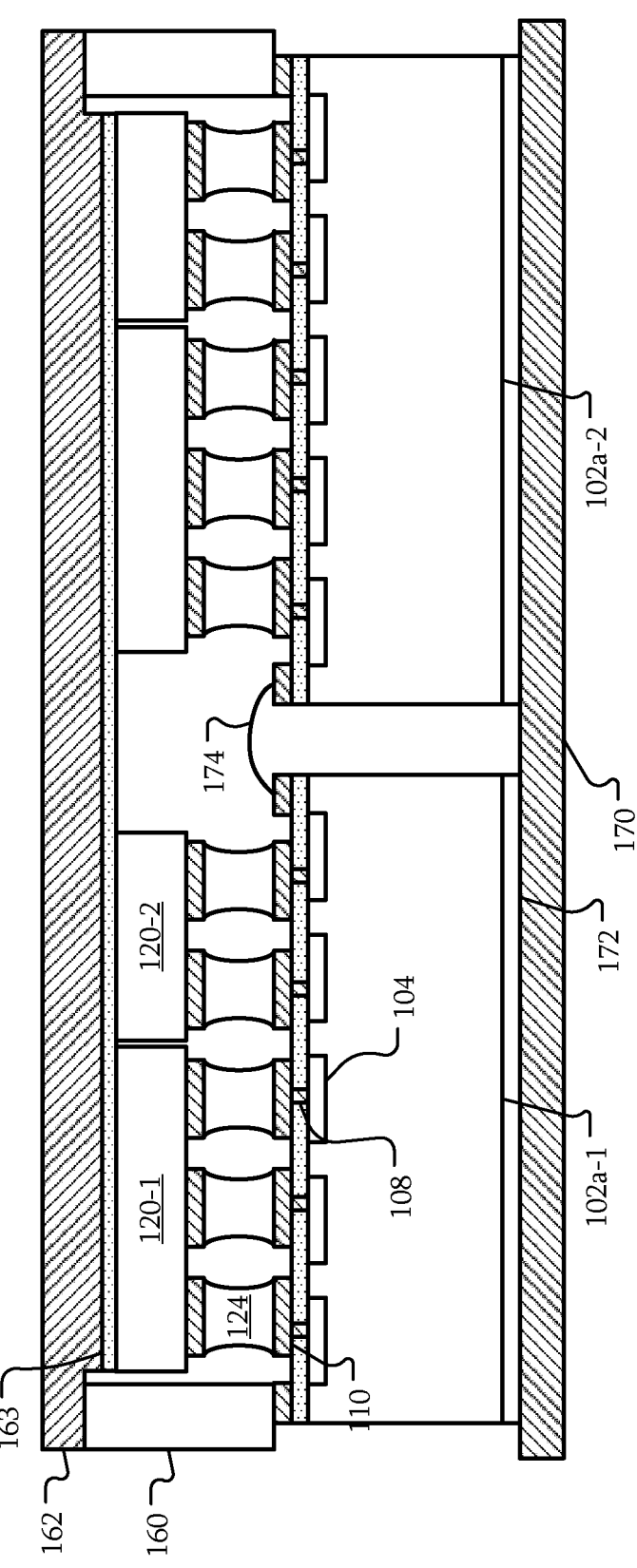

Referring to FIG. 2L, in some embodiments, a sheet glue 163 may be used to attach the back support plate 162 to the semiconductor devices 120 similar to that described with respect to FIG. 1J. In some embodiments, the use of the sheet glue may reduce or eliminate a chance that an adhesive or fill material attaching the back support plate 162 to the semiconductor devices 120 contacts the carrier substrate

170. The lack of contact may make removal of the carrier substrate 170 such as that described with respect to FIG. 2F easier.

The resulting structures such as those of FIGS. 1F-H and 2H-J are examples of detectors using a thinned substrate or substrates 102 according to some embodiments. The semiconductor device 101 of FIGS. 1F-H or the semiconductor devices 101 of FIGS. 2H-J including the thinned substrate 102 may form a sensor of the detector. For example, the semiconductor device or devices 101 may be a sensor for an x-ray detector. Incoming x-ray photons (e.g., included in incoming radiation 150) are incident on the scintillator 140. The scintillator 140 converts the x-ray photons (e.g., of the incoming radiation 150) into light photons 152 of visible light or light of another wavelength that may be detected by the photodetectors 104. As the thinned substrate 102 relies on the back support plate 162 for support and is relatively thin, a smaller amount of the light photons 152 are absorbed by the substrate 102, increasing the DQE.

Although some embodiments have been described with respect to the detection of x-rays, other embodiments include detectors that may be used to detect non-x-ray sources. For example, some embodiments may include photodetectors 104 for detecting visible light infrared light, or ultraviolet light in a variety of application such as imaging, range finding, or the like.

As described above, the thinned substrate 102 the semiconductor device or devices 101 may have a thickness on the order of tens of micrometers. In some embodiments, the thinned substrate 102 may have a thickness of about 10 μm. In other embodiments the thinned substrate 102 may have a thickness of less than about 30 μm. In some embodiments, for human or animal x-ray applications (e.g., medical or veterinary applications), a thinned substrate 102 having a thickness greater than about 30 μm may significantly attenuate the x-rays passing through the thinned substrate 102. As a result, the DQE of the detector 100 is reduced. Although particular examples of thicknesses of the thinned substrate 102 have been given, in other embodiments, the thinned substrate 102 may have other thicknesses. However, the thickness relative to the other dimensions of the thinned substrate 102 may result in the thinned substrate 102 that, without structural support, can be damaged during processing. For example, such subsequent processing may include scintillator deposition, lamination or compression coupling, wire bonding, bump bonding, or other coupling of additional chips, devices, and/or structures to the thinned substrate 102. Delaying thinning of the semiconductor substrate or substrates 102*a* until after the back support plate 162 is installed allows for fabrication operations to rely on the structural support of the thicker semiconductor substrate or substrates 102*a*.

Figure 3A:
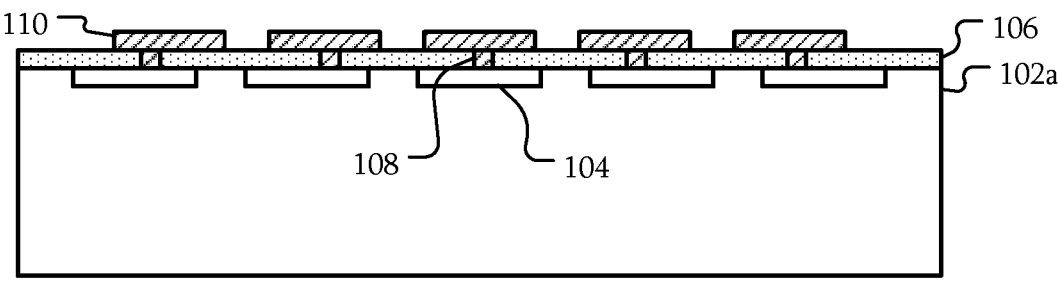
Figure 3B:
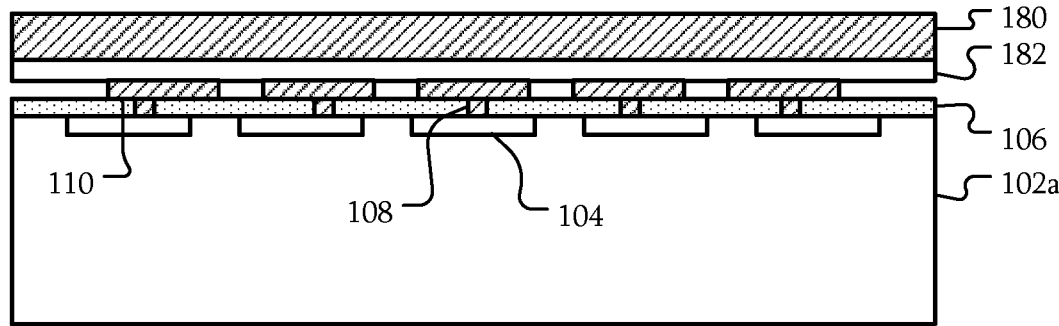

FIGS. 3A-I are block diagrams illustrating techniques of forming a detector according to some other embodiments. Referring to FIG. 3A, a semiconductor substrate 102*a* is provided similar to that of FIG. 1A. However, in FIG. 3B, a first carrier substrate 180 is attached to the side of the semiconductor substrate 102*a* including the photodetectors 104. The first carrier substrate 180 may be attached with an adhesive 182 similar to the adhesive 166, such as a releasable adhesive, a sheet glue or the like.

Figure 3C:
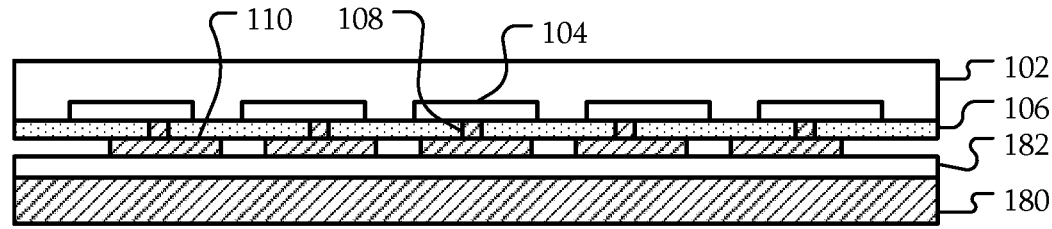

Referring to FIG. 3C, the semiconductor substrate 102*a* is thinned to form the thinned substrate 102 similar to that in FIG. 1F. However, the first carrier substrate 180 may form the structural support for the thinned substrate 102.

Referring to FIG. 3D, a second carrier substrate is attached to the thinned substrate 102. The second carrier substrate 184 may be a substrate similar to the other carrier substrates described herein. The second carrier substrate 184 may be attached using an adhesive 186 similar to the adhesives described herein.

Referring to FIG. 3E, the first carrier substrate 180 is removed. For example, the adhesive 182 may be released by applying heat, light, or the like.

Referring to FIG. 3F, semiconductor devices 120 may be attached to the thinned substrate 102 similar to the attaching of the semiconductor devices 120 to the semiconductor substrate 102*a* in FIG. 1B. However, the second carrier substrate 184 provides structural support for the thinned substrate rather than the un-thinned semiconductor substrate 102*a* in FIG. 1B.

Figure 3G:
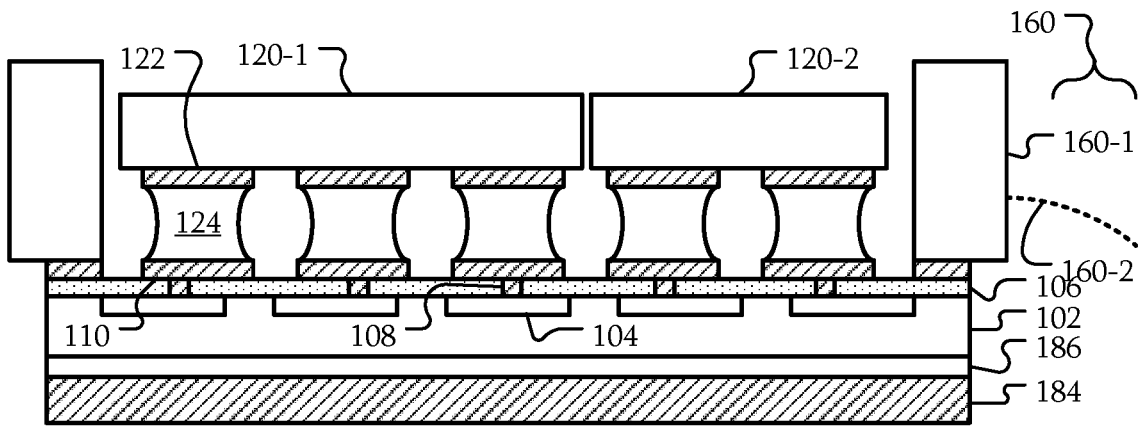

Referring to FIG. 3G, a connection structure 160 is attached to the thinned substrate 102 similar to the attachment of the connection structure 160 to the semiconductor substrate 102*a* in FIG. 1C.

Figure 3H:
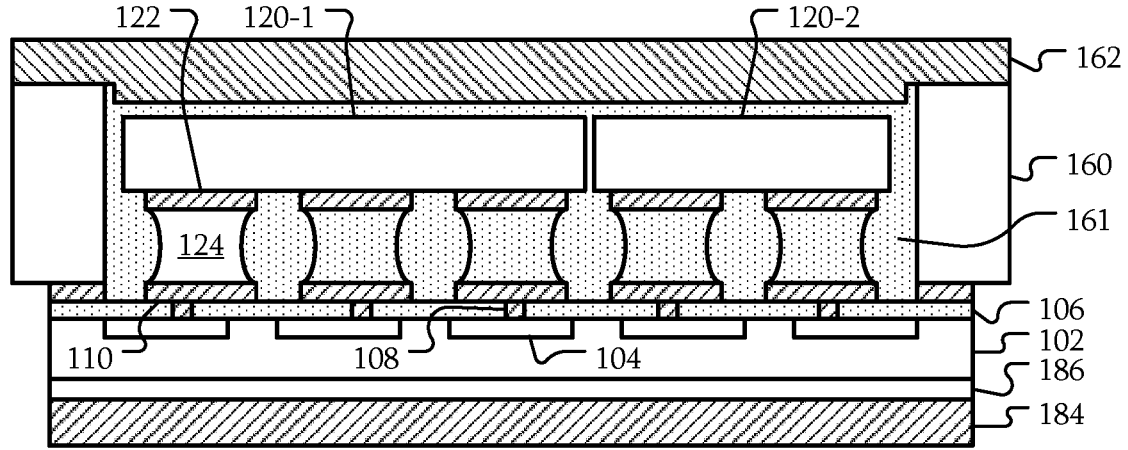

Referring to FIG. 3H, a back support plate 162 is attached to the thinned substrate 102 similar to the attachment of the back support plate 162 to the semiconductor substrate 102*a* in FIG. 1D. In other embodiments, the back support plate 162 may be attached using different techniques, such as by the sheet glue 163 described with respect to FIG. 1J.

Figure 3I:
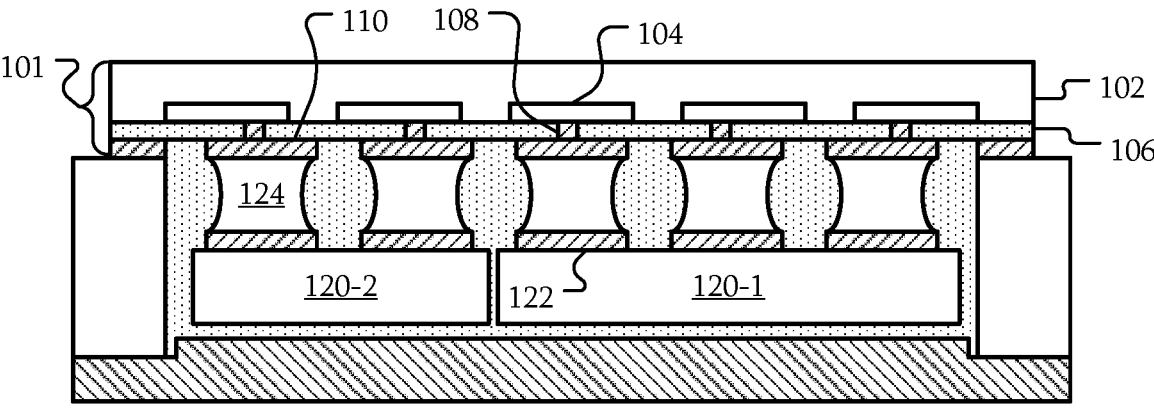

Referring to FIG. 3I, the second carrier substrate 184 may be removed similar to the removal of other carrier substrates described herein. The resulting structure may be further processed as described in FIGS. 1G-1I.

Figure 4A:
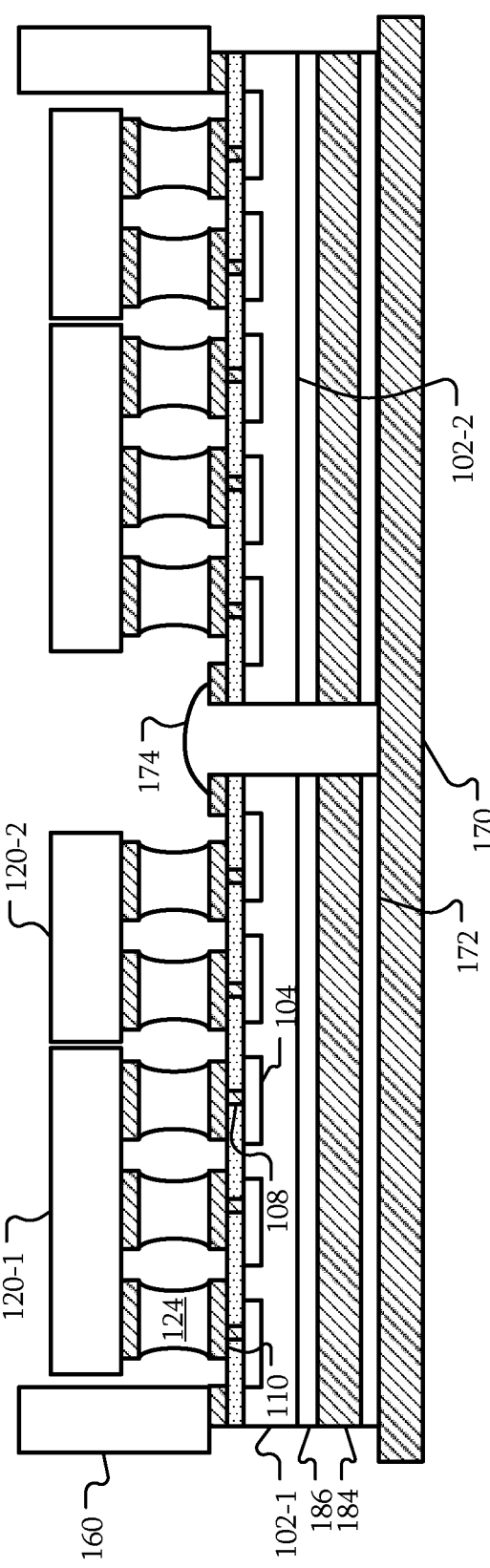
FIGS. 4A-B are block diagrams illustrating techniques of forming a detector according to some other embodiments.
Figure 4B:
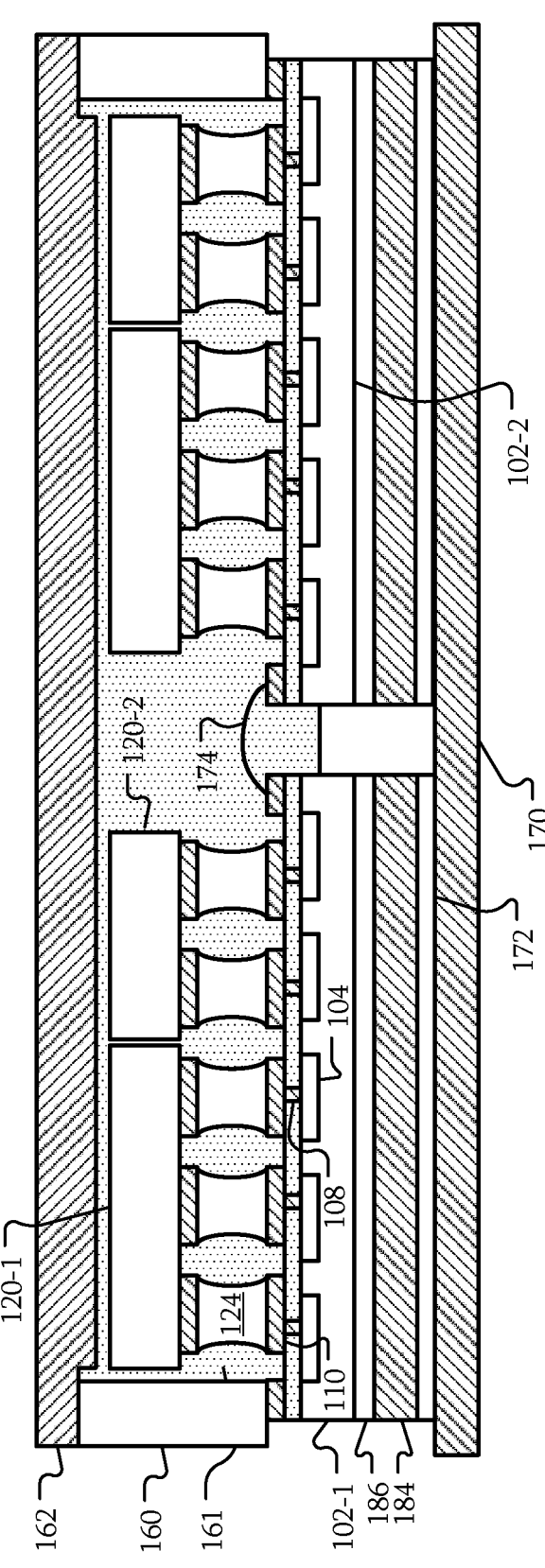

FIGS. 4A-B are block diagrams illustrating techniques of forming a detector according to some other embodiments. Referring to FIG. 4A, in some embodiments, multiple structures such as those described in FIG. 3E may be attached to a carrier substrate 170. In particular, the second carrier substrate 184 of each may be attached to the carrier substrate 170 using adhesive 172. The carrier substrate 170 and adhesive 172 may be similar to those described herein. An electrical connection may be formed similar to that in FIG. 2C, such as by bond wire 174.

Before the attachment to the carrier substrate 170, the structures such as those described in FIG. 3E may have semiconductor devices 120 attached as in FIG. 3F. Alternatively, the attachment of the semiconductor devices 120 may be performed after attaching the second carrier substrates 184 to the carrier substrate 170. Similarly, the connection structure 160 may be attached before or after the attachment of the second carrier substrates 184 to the carrier substrate 170.

Referring to FIG. 4B, a back support plate 162 may be attached similar to that described with respect to FIG. 2D. In other embodiments, the back support plate 162 may be attached using different techniques, such as by the sheet glue 163 described with respect to FIG. 2L.

In subsequent processing, the carrier substrates 170 and 184 may be removed, and other structures attached as described with respect to FIGS. 2H-2J. For example, the adhesive 186 may be release, releasing the carrier substrates 170 and 184. In another example, the carrier substrate 170 may be removed first, followed by the second carrier substrates 184.

Figure 5:
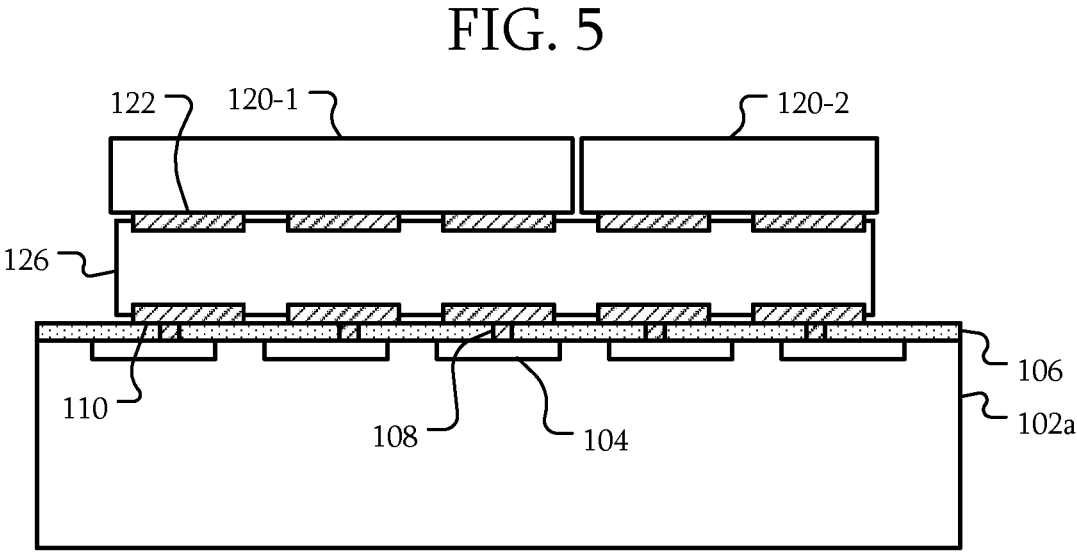
FIG. 5 is a block diagram illustrating techniques of forming a detector according to some embodiments.

FIG. 5 is a block diagram illustrating techniques of forming a detector according to some embodiments. As described above, other techniques may be used to attach the semiconductor device 120 to the semiconductor substrate 102*a*. In some embodiments, the semiconductor device 120 is not soldered to the semiconductor substrate 102*a*. In contrast, an ACF 126 is disposed between the semiconductor device or devices 120 and semiconductor substrate 102*a*.

The ACF 126 forms conductive paths between the pads 110 and pads 122. Although soldering and the use of an ACF 126 have been used as examples, in other embodiments, other techniques may be used to attach one or more semiconductor devices 120 to the thinned substrate 102. In addition, although a single semiconductor substrate 102*a* has been used as an example, different connection techniques may be used with multiple semiconductor substrates 102*a* as in FIG. 2C or 2K.

Figure 6:
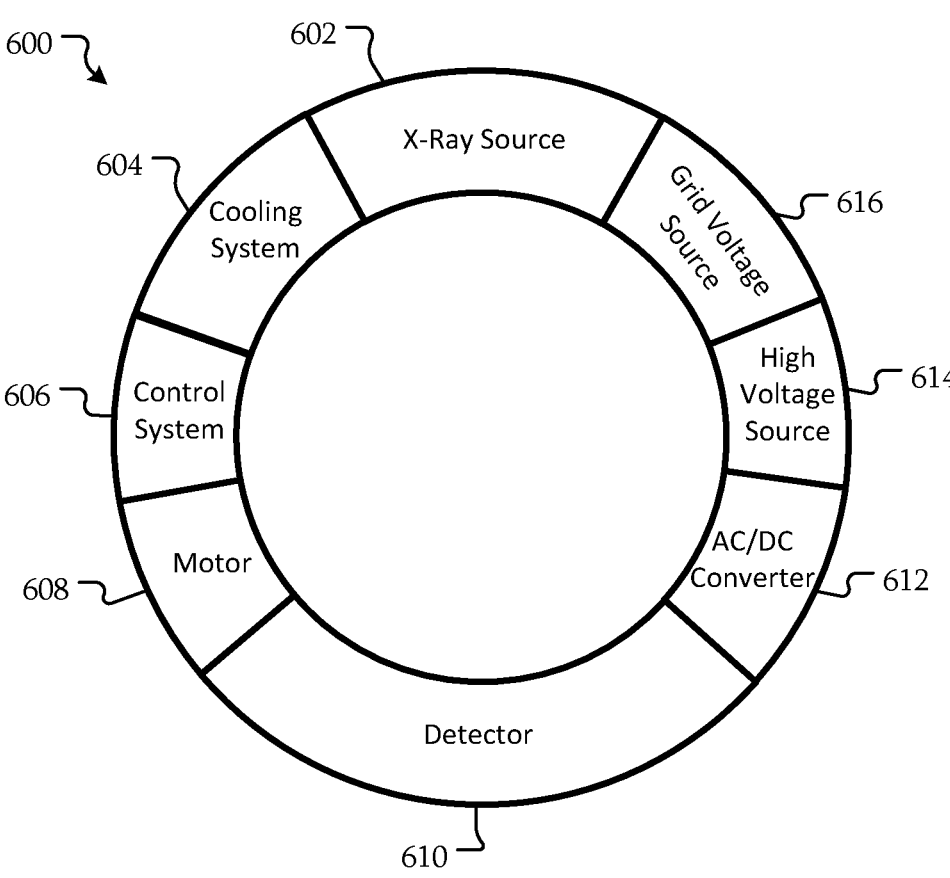
FIG. 6 is a block diagram of a computerized tomography (CT) gantry according to some embodiments.

FIG. 6 is a block diagram of a computerized tomography (CT) gantry according to some embodiments. In some embodiments, the CT gantry includes an x-ray source 602, a cooling system 604, a control system 606, a motor drive 608, a detector 610, an AC/DC converter 612, a high voltage source 614, and a grid voltage source 616. The detector 610 may include a detector, a thinned substrate, or the like as described above. Although particular components have been used as examples of components that may be mounted on a CT gantry, in other embodiments, the other components may be different. Although a CT gantry is used as an example of a system that includes a detector as described herein, detectors described herein may be used in other types of systems.

Figure 7:
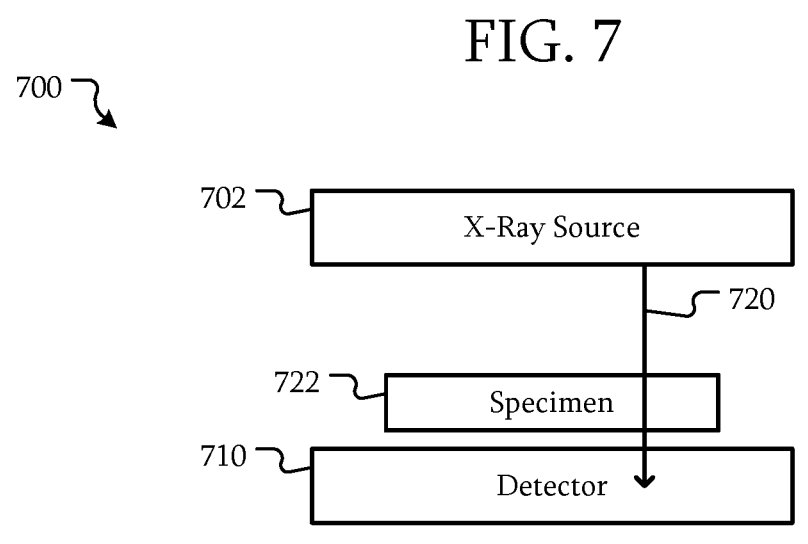

FIG. 7 is a block diagram of a 2D x-ray imaging system according to some embodiments. The imaging system 700 includes an x-ray source 702 and a detector 710. The detector 710 may include a detector, a thinned substrate, or the like as described above. The x-ray source 702 is disposed relative to the detector 710 such that a x-rays 720 may be generated to pass through a specimen 722 and be detected by the detector 710.

Some embodiments include a computer readable medium storing instructions that, when executed, cause the computer to perform one or more of the operations described above. For example, such instructions may include instructions for forming a detector.

Some embodiments include a method, comprising: providing a semiconductor substrate 102 or 102*a* including photodetectors 104 on a first side of the substrate; attaching at least one semiconductor device 120 to the first side of the semiconductor substrate 102*a*; attaching a back support plate 162 to the semiconductor substrate 102 or 102*a* over the at least one semiconductor device; and thinning the semiconductor substrate 102*a* after attaching the back support plate 162.

In some embodiments, thinning the semiconductor substrate 102*a* comprises thinning the semiconductor substrate 102*a* after attaching the back support plate 162.

In some embodiments, thinning the semiconductor substrate 102*a* comprises: attaching the semiconductor substrate 102*a* to a carrier substrate 180; and thinning the semiconductor substrate 102*a* on the carrier substrate 180; and attaching the back support plate 162 comprises attaching the back support plate 162 after thinning the semiconductor substrate 102*a*.

In some embodiments, the method further comprises attaching a carrier substrate 164 to the back support plate 162 before thinning the semiconductor substrate 102*a*; and removing the carrier substrate 164 after thinning the semiconductor substrate 102*a*.

In some embodiments, attaching the at least one semiconductor device 120 to the first side of the semiconductor substrate 102 or 102*a* comprises attaching a plurality of semiconductor devices 120 to the first side of the semiconductor substrate 102 or 102*a*.

In some embodiments, the method further comprises attaching an interposer 160-1 to the substrate before attaching the back support plate 162.

In some embodiments, the method further comprises attaching an electrical connection structure 160-2 to the semiconductor substrate 102 or 102a before attaching the back support plate 162.

In some embodiments, the method further comprises applying a fill material between the back support plate 162 and the semiconductor substrate 102 or 102a.

In some embodiments, the method further comprises attaching a scintillator 140 to the thinned side of the semiconductor substrate 102. In some embodiments, attaching can include depositing, gluing, or compressing the layer or material, such as the scintillator 140, onto the semiconductor substrate 102.

In some embodiments, the method further comprises attaching an optical substrate 130 to the thinned side of the semiconductor substrate 102.

In some embodiments, the method further comprises attaching at least one of a scintillator 140 and an optical substrate 130 to the thinned side of the semiconductor substrate 102.

In some embodiments, the method further comprises attaching a scintillator 140 to the optical substrate 130.

In some embodiments, thinning the semiconductor substrate 102a comprises thinning the semiconductor substrate 102a to a thickness less than 30 μm.

Some embodiments include a computer readable medium having instructions stored thereon adapted to perform one or more of the methods described herein.

Some embodiments include a method, comprising: providing a plurality of semiconductor substrates 102 or 102a including photodetectors 104 on a first side of each of the semiconductor substrates 102 or 102a; attaching a second side of each of the semiconductor substrates 102 or 102a to a first carrier substrate 170; attaching at least one semiconductor device 120 to the first side of each of the semiconductor substrate 102 or 102a; attaching a back support plate 162 to the semiconductor substrate 102a over the at least one semiconductor device; and thinning the semiconductor substrate 102a.

In some embodiments, thinning the semiconductor substrates 102a comprises thinning the semiconductor substrates 102a after attaching the back support plate 162.

In some embodiments, thinning the semiconductor substrates 102a comprises: attaching the semiconductor substrates 102a to a carrier substrate 180; and thinning the semiconductor substrates 102a on the carrier substrate 180; and attaching the back support plate 162 comprises attaching the back support plate 162 after thinning the semiconductor substrates 102a.

In some embodiments, attaching the at least one semiconductor device 120 to the first side of each of the semiconductor substrates 102 or 102a comprises attaching the at least one semiconductor device 120 to the first side of each of the semiconductor substrates 102 or 102a before attaching the second side of each of the semiconductor substrates 102 or 102a to the first carrier substrate 170.

In some embodiments, the method further comprises electrically connecting at least one of the semiconductor substrates 102 or 102a to another of the semiconductor substrates 102 or 102a.

In some embodiments, the method further comprises attaching an interposer 160-1 to a plurality of the semiconductor substrates 102 or 102a.

In some embodiments, the method further comprises removing the first carrier substrate 170 before thinning the semiconductor substrates 102 or 102a.

In some embodiments, the method further comprises attaching a scintillator 140 to the thinned side of the semiconductor substrate 102.

In some embodiments, the semiconductor substrate 102 has a thickness less than 30 μm.

Some embodiments include a system, comprising: means for detecting incident radiation; a plurality of means for processing the detected incident radiation; and means for structurally supporting the means for detecting the incident radiation; wherein the plurality of means for processing the detected incident radiation are attached to the means for detecting the incident radiation between the means for detecting the incident radiation and the means for structurally supporting the means for detecting the incident radiation. Examples of the system include FIGS. 1F, 1G, 1H, 1I, 2G, 2H, 2I, and 2K.

Examples of the means for detecting incident radiation include substrates 102 and 102a including photodetectors 104. Examples of the plurality of means for processing the detected incident radiation include the semiconductor devices 120. Examples of the means for structurally supporting the means for detecting the incident radiation include the back support plate 162, underfill material 161, and the connection structure 160 including the interposer 160-1.

In some embodiments, the system further comprises means for electrically connecting to the means for processing the detected incident radiation. Examples of the means for electrically connecting to the means for processing the detected incident radiation include the electrical connection structure 160-2.

Although the structures, devices, methods, and systems have been described in accordance with particular embodiments, one of ordinary skill in the art will readily recognize that many variations to the particular embodiments are possible, and any variations should therefore be considered to be within the spirit and scope disclosed herein. Accordingly, many modifications may be made by one of ordinary skill in the art without departing from the spirit and scope of the appended claims.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description. These additional embodiments are determined by replacing the dependency of a given dependent claim with the phrase "any of the claims beginning with claim [x] and ending with the claim that immediately precedes this one," where the bracketed term "[x]" is replaced with the number of the most recently recited independent claim. For example, for the first claim set that begins with independent claim 1, claim 3 can depend from either of claims 1 and 2, with these separate dependencies yielding two distinct embodiments; claim 4 can depend from any one of claims 1, 2, or 3, with these separate dependencies yielding three distinct embodiments; claim 5 can depend from any one of claims 1, 2, 3, or 4, with these separate dependencies yielding four distinct embodiments; and so on.

Recitation in the claims of the term "first" with respect to a feature or element does not necessarily imply the existence of a second or additional such feature or element. Elements specifically recited in means-plus-function format, if any, are intended to be construed to cover the corresponding structure, material, or acts described herein and equivalents thereof in accordance with 35 U.S.C. § 112 ¶ 6. Embodiments of the invention in which an exclusive property or privilege is claimed are defined as follows.

The invention claimed is:

1. A method, comprising:

providing a semiconductor substrate including photodetectors on a first side of the semiconductor substrate;

attaching a plurality of semiconductor chips to the first side of the semiconductor substrate;

attaching a back support plate to the semiconductor substrate over the plurality of semiconductor chips, the back support plate comprising a central protrusion and peripheral recesses extending around at least a portion of the central protrusion; and thinning the semiconductor substrate.

2. The method of claim 1, wherein thinning the semiconductor substrate comprises thinning the semiconductor substrate after attaching the back support plate.

3. The method of claim 1, wherein:

thinning the semiconductor substrate comprises:

attaching the semiconductor substrate to a carrier substrate; and thinning the semiconductor substrate on the carrier substrate; and attaching the back support plate comprises attaching the back support plate after thinning the semiconductor substrate.

4. The method of claim 1, further comprising:

attaching a carrier substrate to the back support plate before thinning the semiconductor substrate; and removing the carrier substrate after thinning the semiconductor substrate.

5. The method of claim 1, further comprising attaching an interposer to the semiconductor substrate before attaching the back support plate.

6. The method of claim 1, further comprising attaching an electrical connection structure to the semiconductor substrate before attaching the back support plate.

7. The method of claim 1, further comprising attaching at least one of a scintillator or an optical substrate to a thinned side of the semiconductor substrate.

8. A computer readable medium having instructions stored thereon adapted to perform the method of claim 1.

9. A method, comprising:

providing a plurality of semiconductor substrates including photodetectors on a first side of each of the semiconductor substrates;

attaching a second side of each of the semiconductor substrates to a first carrier substrate;

attaching at least one semiconductor device to the first side of each of the semiconductor substrates;

attaching a back support plate to the semiconductor substrates over the at least one semiconductor device; and thinning the semiconductor substrates.

10. The method of claim 9, wherein thinning the semiconductor substrates comprises thinning the semiconductor substrates after attaching the back support plate.

11. The method of claim 9, wherein attaching the at least one semiconductor device to the first side of each of the semiconductor substrates comprises attaching the at least one semiconductor device to the first side of each of the semiconductor substrates before attaching the second side of each of the semiconductor substrates to the first carrier substrate.

12. The method of claim 9, further comprising electrically connecting at least one of the semiconductor substrates to another of the semiconductor substrates.

13. The method of claim 9, further comprising attaching an interposer or an electrical connection structure to multiple of the semiconductor substrates.

14. The method of claim 9, further comprising removing the first carrier substrate before thinning the semiconductor substrates.

15. The method of claim 9, further comprising attaching an optical substrate or a scintillator to a thinned side of the semiconductor substrates.

16. A method, comprising:

providing a semiconductor substrate comprising a plurality of photodetectors for detecting incident radiation;

attaching a plurality of semiconductor chips for processing the detected incident radiation to the semiconductor substrate;

attaching a back support plate for structurally supporting the semiconductor substrate to the semiconductor substrate, the back support plate comprising a central protrusion and peripheral recesses extending around at least a portion of the central protrusion; and thinning the semiconductor substrate;

wherein the plurality of semiconductor chips are attached to the semiconductor substrate between the semiconductor substrate and the back support plate.

17. The method of claim 11, further comprising:

attaching an electrical connection structure for electrically connecting to the plurality of semiconductor chips to the semiconductor substrate.

18. The system of claim 16, further comprising:

attaching a scintillator for converting the detected incident radiation into light photons to the thinned semiconductor substrate; wherein the plurality of photodetectors detect the light photons.

* * * * *